United States Patent [19]

Mankovitz

[11] Patent Number: 5,677,895
[45] Date of Patent: Oct. 14, 1997

[54] APPARATUS AND METHODS FOR SETTING TIMEPIECES

[76] Inventor: Roy J. Mankovitz, 18057 Medley Dr., Encino, Calif. 91316

[21] Appl. No.: 292,358

[22] Filed: Aug. 18, 1994

[51] Int. Cl.⁶ ................ G04B 47/00; G04C 11/02; H04N 5/445; H04M 11/00
[52] U.S. Cl. ............... 368/10; 368/4; 368/47; 368/187; 348/563; 348/734; 379/93; 379/102
[58] Field of Search ............... 368/4, 10, 13, 368/46, 47, 52, 185–187; 348/563, 734; 379/93–99, 102, 104, 105, 106

[56] References Cited

U.S. PATENT DOCUMENTS

| | | | |
|---|---|---|---|
| 2,188,145 | 1/1940 | Frantz | 58/24 |
| 2,671,131 | 3/1954 | Johnson | 178/6 |
| 3,881,310 | 5/1975 | Gerum et al. | 58/35 |
| 4,023,344 | 5/1977 | Mukaiyama | 58/35 |
| 4,087,958 | 5/1978 | Ebihara et al. | 58/25 |
| 4,130,738 | 12/1978 | Sandstedt | 179/90 B |
| 4,187,518 | 2/1980 | Martin et al. | 358/93 |
| 4,394,539 | 7/1983 | Chu | 179/2 TC |
| 4,501,502 | 2/1985 | Van Orsdel | 368/47 |
| 4,620,229 | 10/1986 | Amano et al. | 358/194.1 |
| 4,718,112 | 1/1988 | Shinoda | 455/151 |
| 4,825,200 | 4/1989 | Evans et al. | 341/23 |
| 4,845,773 | 7/1989 | Attallah | 379/102 |
| 4,866,542 | 9/1989 | Shimada et al. | 360/10.3 |
| 4,965,557 | 10/1990 | Schepers et al. | 340/711 |
| 5,016,273 | 5/1991 | Hoff | 380/10 |
| 5,056,070 | 10/1991 | Shibuya et al. | 368/10 |
| 5,063,543 | 11/1991 | Shibuya et al. | 368/29 |
| 5,089,814 | 2/1992 | DeLuca et al. | 340/825.49 |
| 5,166,911 | 11/1992 | Misawa et al. | 368/10 |
| 5,226,090 | 7/1993 | Kimura | 381/110 |
| 5,228,077 | 7/1993 | Darbee | 379/102 |
| 5,251,191 | 10/1993 | Sturzl et al. | 368/47 |
| 5,255,313 | 10/1993 | Darbee | 379/10 |
| 5,258,964 | 11/1993 | Koma et al. | 368/47 |
| 5,265,070 | 11/1993 | Minowa | 368/47 |
| 5,319,374 | 6/1994 | Desai et al. | 342/387 |
| 5,329,500 | 7/1994 | Baik et al. | 368/10 |
| 5,440,559 | 8/1995 | Gaskill | 370/95.1 |

*Primary Examiner*—Vit W. Miska
*Attorney, Agent, or Firm*—Christie, Parker & Hale, LLP

[57] ABSTRACT

Apparatus and methods are provided for setting timepieces. A system for setting timepieces includes a television signal receiver having a first clock for keeping time in the television signal receiver, a device for extracting a time from a television signal received by the television signal receiver, a device for updating the time kept by the first clock by the time extracted from the television signal, and a first transmitter for transmitting time read from the first clock to a remote controller for setting the time on a second clock for keeping time in the remote controller. The system also includes the remote controller adapted to control at least one appliance, the remote controller having a second clock for keeping time in the remote controller, a first receiver coupled to the second clock for receiving the time transmitted by the first transmitter, a device for updating the time kept by the second clock in the remote controller by the time received from the television signal receiver, and a second transmitter for transmitting time read from the second clock to a timepiece for setting the time in the timepiece. Finally, the system includes the timepiece having a third clock for keeping time in the timepiece, a second receiver for receiving a time transmitted from the remote controller, and a device for updating the time kept by the third clock in the timepiece by the time received from the remote controller.

23 Claims, 20 Drawing Sheets

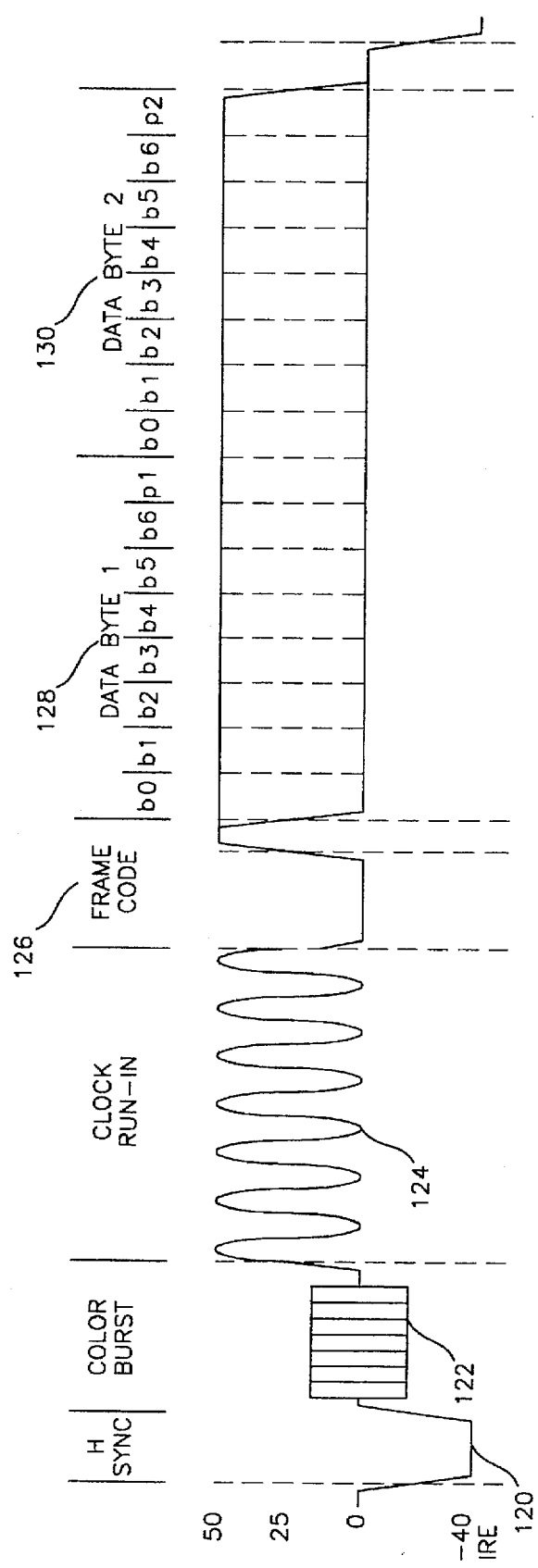

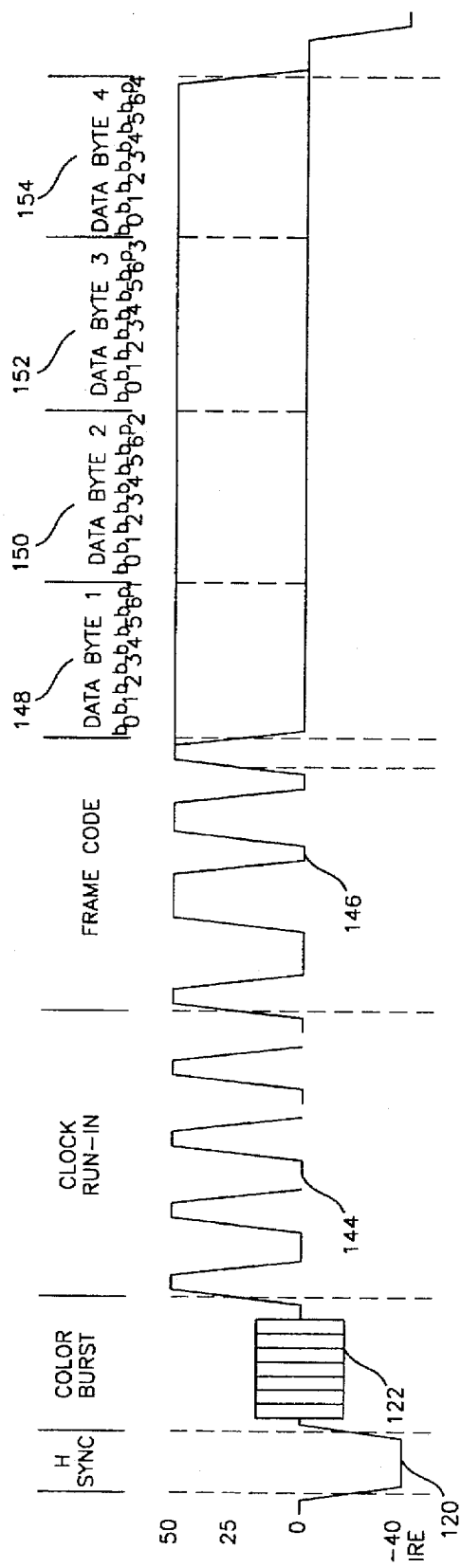

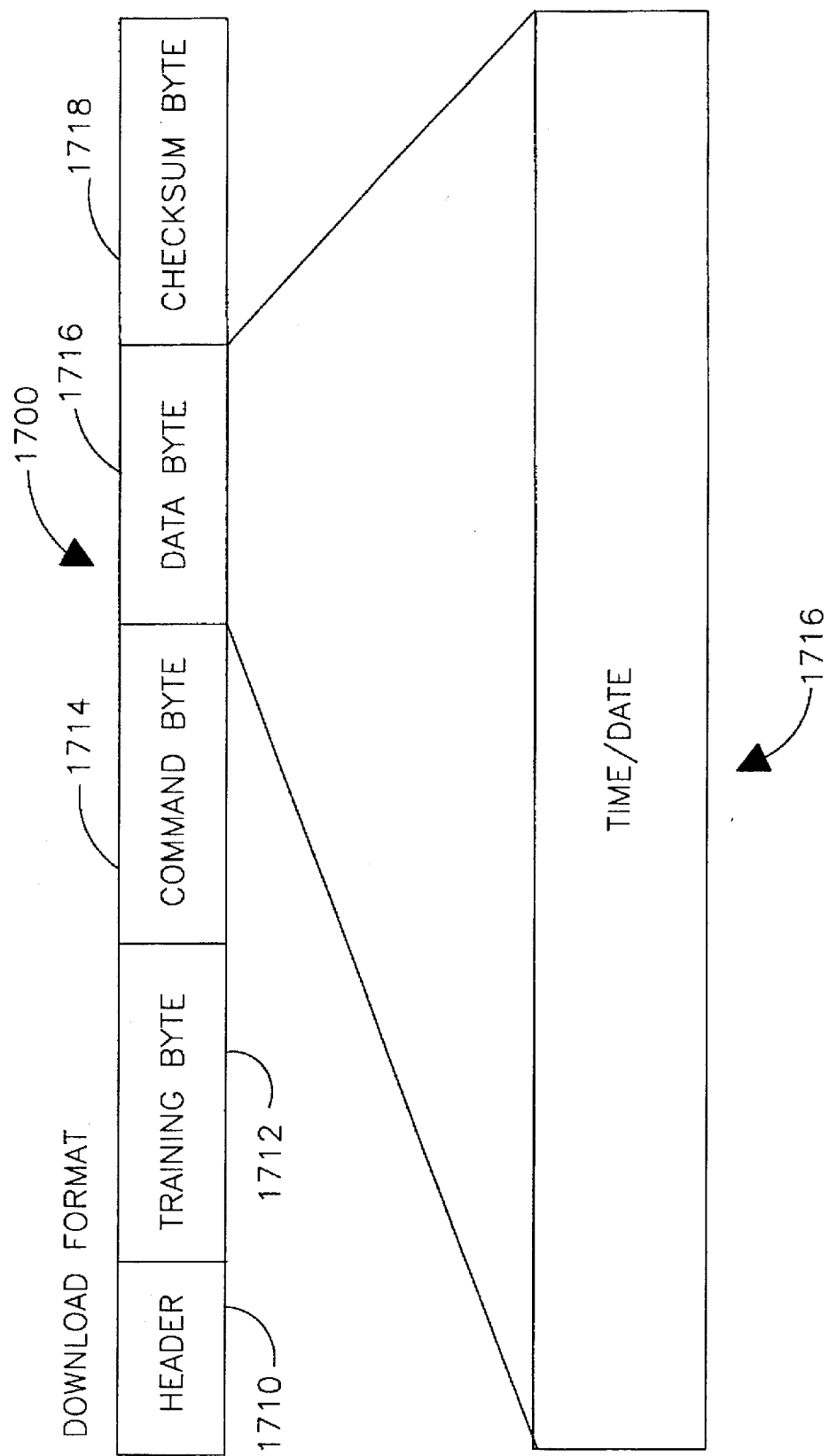

ns.com/>5,677,895

APPARATUS AND METHODS FOR SETTING TIMEPIECES

BACKGROUND OF THE INVENTION

1. Field of the Invention

This invention relates to remote controllers for controlling appliances and particularly to apparatus and methods for setting time on a timepiece.

2. Description of the Related Art

There is a constant need to accurately know the time-of-day. To satisfy this need mankind has invented many timepieces from sundials to electronic watches. However, a continuing problem is that even the most accurate watches drift over time and need to be reset. There have been a number of attempts at automating the resetting of clocks. U.S. Pat. No. 4,023,344 (Mukaiyama) discloses a first timepiece for keeping a time standard that includes a transmitter that can reset a second timepiece that has a receiver that is placed in close proximity with the standard timepiece. U.S. Pat. No. 5,265,070 (Minowa) discloses another such device that has two different times of day in the second timepiece. The two different times of day can be reset by a transmitted standard time. U.S. Pat. No. 4,501,502 (Van Orsdel) teaches transmitting a signal periodically from a satellite to an analog timepiece for setting the timepiece. U.S. Pat. No. 3,881,310 (Gerum) teaches a device that attaches to an AC power line, which normally supplies the synchronizing 60 Hertz waveform to electric clocks driven by the AC power line, and sends a signal to a wireless clock to synchronize the wireless clock to the AC power line. U.S. Pat. Nos. 5,089,814 and 5,258,964 (DeLuca and Koma, respectively) teach apparatus for automatically adjusting the time zone of clocks as time zones are crossed. U.S. Pat. No. 5,319,374 (Desai) teaches correcting clocks in vehicles by transmitting satellite time signals to the vehicles.

The foregoing time resetting apparatus have the shortcomings of being impractical and expensive. For example, providing a very accurate time standard to each household and business in the manner taught by Mukaiyama and others would be very expensive. Standards for time normally require an atomic clock or other very expensive device.

Other patents teach remotely commanding the display of a clock on a television. For example, U.S. Pat. Nos. 4,620,229 and 4,965,557 (Amano and Schepers, respectively) teach sending a command from a remote controller for commanding a time on a clock in the television to be displayed on the television screen. U.S. Pat. No. 5,056,070 (Shibuya) discloses a remote controller with a display and a clock and a button, which when pressed causes the time on the clock of the remote controller to be displayed on a video tape recorder (VTR). Amano and Schepers do not assist in the accurate setting of the clock in the television. Shibuya has the shortcoming that there is no automatic method of correcting the drift that will occur in the clock in the remote controller to ensure that it matches a standard. Thus the time displayed by the VTR may be inaccurate.

SUMMARY OF THE INVENTION

An object of the present invention is to provide practical methods and apparatus for setting timepieces, including watches to match another time updated periodically to maintain accuracy.

Another object of the present invention is to provide a remote controller for setting time on timepieces. The remote controller also can be used to control appliances such as televisions, video cassette recorders (VCRs), cable boxes, and satellite receivers.

Another object of the invention is to provide apparatus and methods for updating the time kept by the remote controller.

According to the invention, methods and apparatus are provided for setting timepieces. In one embodiment, a system for setting timepieces includes a television signal receiver having a first clock for keeping time in the television signal receiver, a device for extracting a time from a television signal received by the television signal receiver, a device for updating the time kept by the first clock by the time extracted from the television signal, and a first transmitter for transmitting time read from the first clock to a remote controller for setting the time on a second clock for keeping time in the remote controller. The system also includes the remote controller adapted to control at least one appliance, the remote controller having a second clock for keeping time in the remote controller, a first receiver coupled to the second clock for receiving the time transmitted by the first transmitter, a device for updating the time kept by the second clock in the remote controller by the time received from the television signal receiver, and a second transmitter for transmitting time read from the second clock to a timepiece for setting the time in the timepiece. Finally, the system includes the timepiece having a third clock for keeping time in the timepiece, a second receiver for receiving a time transmitted from the remote controller, and a device for updating the time kept by the third clock in the timepiece by the time received from the remote controller.

Other objects and many of the attendant features of this invention will be more readily appreciated as the same becomes better understood by reference to the following detailed descriptions and considered in connection with the accompanying drawings in which like reference symbols designate like parts throughout the figures.

BRIEF DESCRIPTION OF THE DRAWINGS

FIG. 4 is a timing diagram of the standard data format (1X) for transmitting data in the VBI;

FIG. 5 is a timing diagram of the accelerated data format (2X) for transmitting data in the VBI;

FIG. 13 is a diagram illustrating the download format which contains a header, training byte, command byte, data bytes, and checksum byte, according to an embodiment of the invention.

DETAILED DESCRIPTION

Figure 1A:
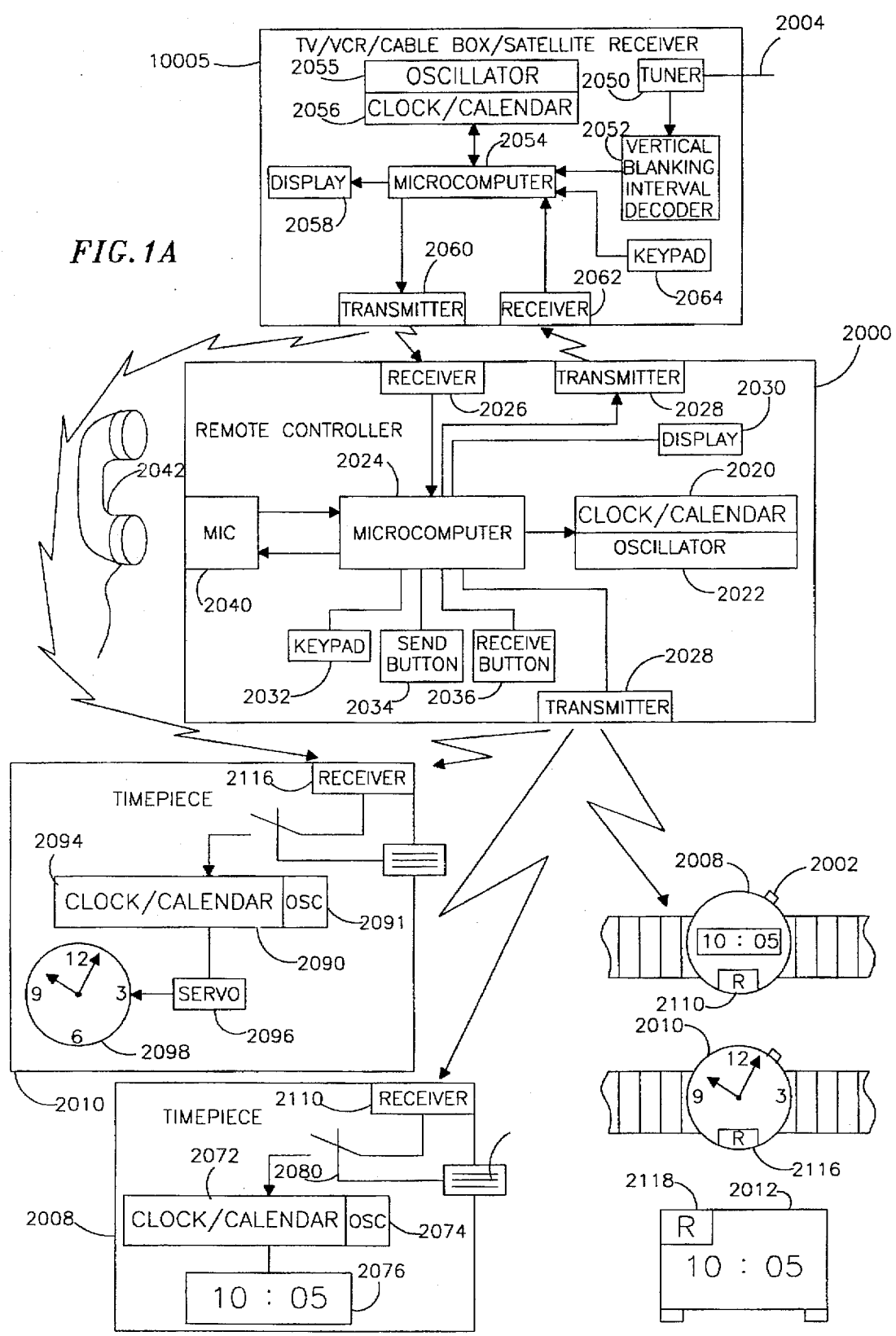
FIG. 1A is a drawing showing a system for setting clocks according to the present invention.

Referring now to the drawings, and more particularly to FIG. 1A, there is shown a system for setting time in a timepiece. The system consists of timepieces 2008, 2010, and 2012, remote controller 2000, telephone receiver 2042, and television signal receiver 10005. The television signal receiver 10005 can be a television, a VCR, a cable box, or a satellite receiver.

In one embodiment of the present invention the telephone receiver 2042 operates together with the remote controller 2000 to set the time on timepieces such as timepiece 2008. In another embodiment the television signal receiver 10005 operates together with the remote controller 2000 to set the time on timepieces such as timepiece 2008. In yet another embodiment the television signal receiver 10005 operates directly with timepieces such as timepiece 2010 to set the time on the timepiece. All of these embodiments are illustrated in FIG. 1A.

The remote controller consists of a microcomputer 2024 that interfaces with a clock/calendar 2020 that is driven by an oscillator 2022. The remote controller has a display 2030 and a keypad 2032. A send button 2034 and a receive button 2036 are included in keypad 2032. A remote controller 2000 has transmitters 2028 that are used to transmit commands to appliances as well as to timepieces. The term appliances includes appliances such as televisions, VCRs, cable boxes, and satellite receivers.

In some embodiments the remote controller also has a receiver 2026 for receiving commands from a television signal receiver 10005. In other embodiments the remote controller 2000 has a microphone 2040 for receiving audio signals from a source such as a telephone receiver 2042.

As indicated above the television signal receiver 10005 can be a television, VCR, cable box, or a satellite receiver. All of these devices receive a television signal and perform certain operations upon the television signal. The essential elements for the television signal receiver 10005 are shown in FIG. 1A. A television signal line 2002 is sent to a tuner 2050, which can select a particular channel. The tuner can be part of television signal receiver 10005 or the function of tuning can be performed before the television signal is sent to the television signal receiver 10005. An output of the tuner 2050 is sent to vertical blanking interval decoder 2052, which can decode information contained within the vertical blanking interval of a video signal. The vertical blanking interval and the vertical blanking interval decoder are further described below. The output of the vertical blanking interval decoder is sent to a microcomputer 2054 which has interfaces to clock/calendar 2056, display 2058, transmitter 2060, and receiver 2062. The clock/calendar has associated with it an oscillator 2055 for maintaining time on the clock/calendar.

A timepiece in the present invention such as timepiece 2008 contains a receiver 2110, a clock/calendar 2072, which maintains time via an oscillator 2074, and a display 2076 for showing the time. The receiver 2110 can be an infrared receiver. Timepiece 2008 is a typical digital electronic wrist watch. Timepiece 2010 is a typical electronic wrist watch with an analog display. Timepiece 2010 contains a receiver 2116, a clock/calendar 2094, an oscillator 2091, and a servo 2096 for driving the analog display 2098.

Now having described the key components of the system, the various embodiments of a system for setting time on a timepiece will now be described.

In the first embodiment, the components of the system include a telephone receiver 2042, a remote controller 2000, and a timepiece, such as timepiece 2008. In this embodiment the remote controller can transmit time that is maintained on clock/calendar 2020, to the timepiece via transmitter 2028. The timepiece, such as timepiece 2008, receives the transmitted time via receiver 2110 and updates the time in clock/calendar 2072 to match the transmitted time. The transmitted time can include a date in addition to the time-of-day. To send the time from the remote controller to the timepiece, the user pushes send button 2034. This activates microcomputer 2024, which retrieves the time from clock/calendar 2020 and transmits the time via transmitter 2028.

Updating the time on the timepiece with the time in the clock/calendar in the remote controller, assumes that the time in the remote controller is more accurate than the time in the timepiece. It is well known that the time on timepieces will drift over time and eventually need to be reset. A time maintained in a remote controller will also drift over time; however, it is anticipated that the user will periodically reset the time in the remote controller by telephoning a station that can download an accurate time to the clock/calendar 2020 in the remote controller 2000. The time is sent via an audio signal that is inputted to the remote controller via microphone 2040. Devices have been built using this download technology and are described below with reference to custom programmer 1100. Thus, in the first embodiment, the user updates the clock/calendar 2020 in the remote controller 2000 periodically to maintain its accuracy. Then the remote controller can be used to transmit an accurate time to timepieces that include a receiver that can receive the transmitted time.

For situations in which the timepiece is battery driven such as wrist watches, it is not necessary to continuously power the receiver, such as receiver 2110. The user can push a reset button 2002 on the wrist watch to power the receiver 2110 so that the transmitted time will be sent to the clock/calendar 2072. This is schematically represented by switch 2080. Timepiece 2012 is a typical plug-in electrical clock, which does not need a reset button, because power is readily available. Thus, whenever an update time is transmitted from the remote controller, the time will be updated in the clock/calendar for the plug-in electrical timepiece.

In another embodiment the time is embedded in a video signal which is decoded by a television signal receiver and used to update a clock/calendar in the television signal receiver. Such a television signal receiver 10005 is illustrated in FIG. 1A. A time is embedded in the television signal on line 2004. A vertical blanking interval decoder 2052 can extract the time from the vertical blanking interval of the video signal and send the time to microcomputer 2054 which updates the time in clock/calendar 2056 to the time extracted from the video signal. The time in clock/calendar 2056 can be displayed on display 2058.

In this embodiment it is not necessary for the remote controller 2000 to include a microphone 2040, because in this embodiment the user updates the time in the clock/calendar 2020 in remote controller 2000 by requesting that the time be sent from the television signal receiver 10005 to the remote controller 2000. The user does this by pushing send button 2034. The microcomputer 2024 responds by transmitting a command via transmitter 2028 to receiver 2062 and to microcomputer 2054 in the television signal receiver 10005. The microcomputer 2054 responds by reading the time in clock/calendar 2056 and transmitting the time in clock/calendar 2056 via transmitter 2060 to receiver 2026 in the remote controller 2000. The microcomputer 2024 then updates the clock time in the clock/calendar 2020 to match the received time. In this manner the time in the clock/calendar 2020 of the remote controller 2000 can be kept relatively accurate compared to the time on the timepiece. When the user wants to update the time on the timepiece such as timepiece 2008, the user presses send button 2034 twice, for example, to distinguish from sending a command to the television signal receiver 10005. This causes the time in clock/calendar 2020 to be sent to the timepiece via transmitter 2028. The timepiece then receives the transmitted time and sets the clock/calendar, such as clock/calendar 2072 in timepiece 2008, to the received time.

In another embodiment the television signal receiver 10005 can transmit the time from clock/calendar 2056 directly to the timepieces such as timepiece 2008 via transmitter 2060. For example, the television signal receiver could transmit the time periodically so that whenever the user presses a reset button such as reset button 2002, that a time transmission will be received by the timepiece. The disadvantage of this embodiment is that the user must transport the timepiece to be updated to the vicinity of the television signal receiver. This is in contrast to the embodiment that updates the time in the remote controller, which is portable and can be taken around a house, for example, to update timepieces wherever they are in the house. However, given the amount of time spent watching television, this embodiment virtually guarantees that a wrist watch will be frequently updated to an accurate time.

Figure 1B:
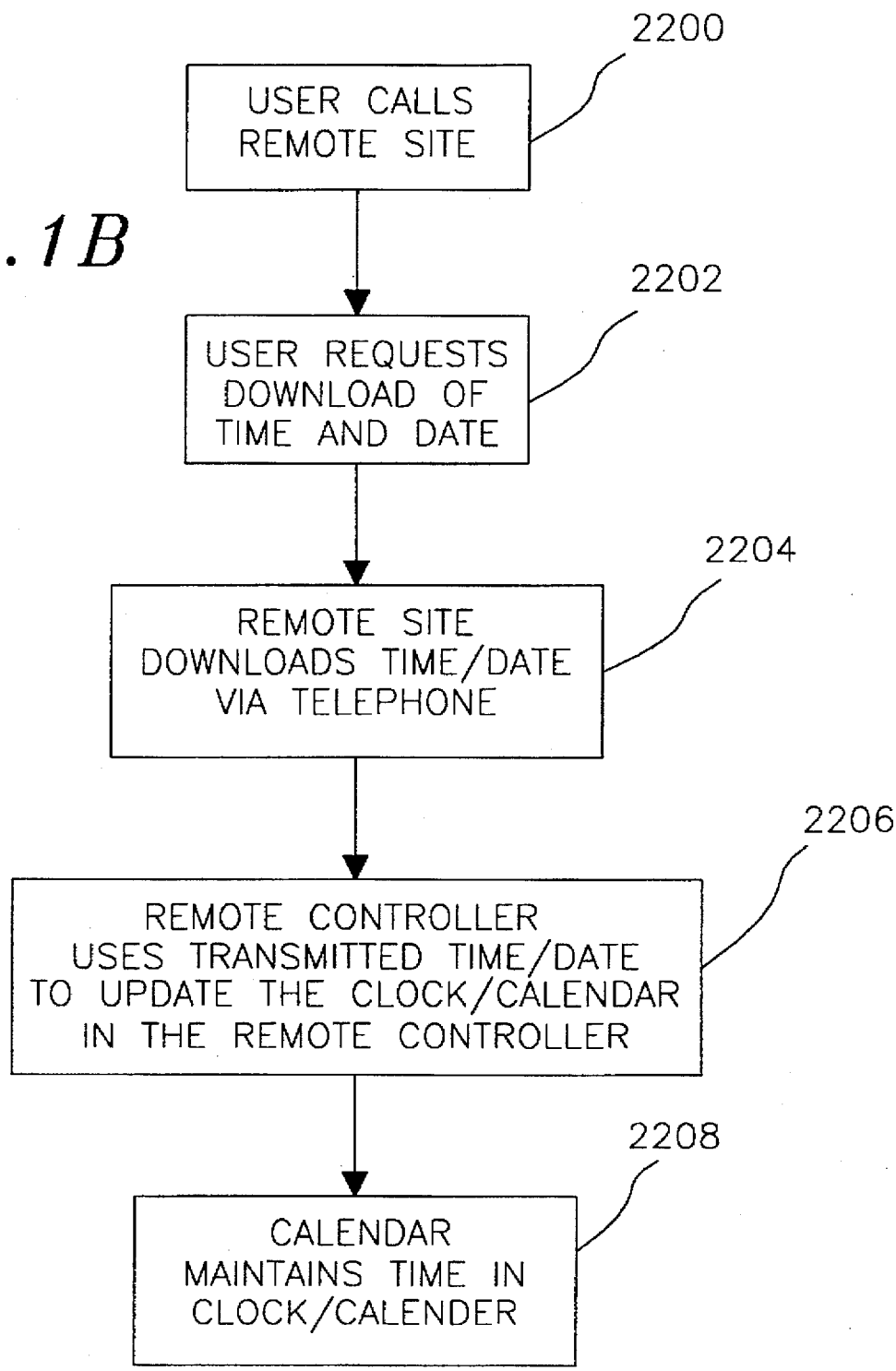
FIGS. 1B–1F are flow diagram of methods for operating the system of FIG. 1A according to the present invention.

FIG. 1B is a method for downloading time to a remote controller via a telephone. In step 2200 the user calls a remote site. Then in step 2202 the user requests a download of the time and date. The request can be made via touchtone keys on the phone if the remote site is a computerized and automated site. In step 2204 the remote site downloads the time and date via the telephone. Then in step 2206 the remote controller uses the transmitted time and date to update the clock/calendar in the remote controller. Finally in step 2208 the remote controller maintains the time in the clock/calendar by using an oscillator.

Figure 1C:
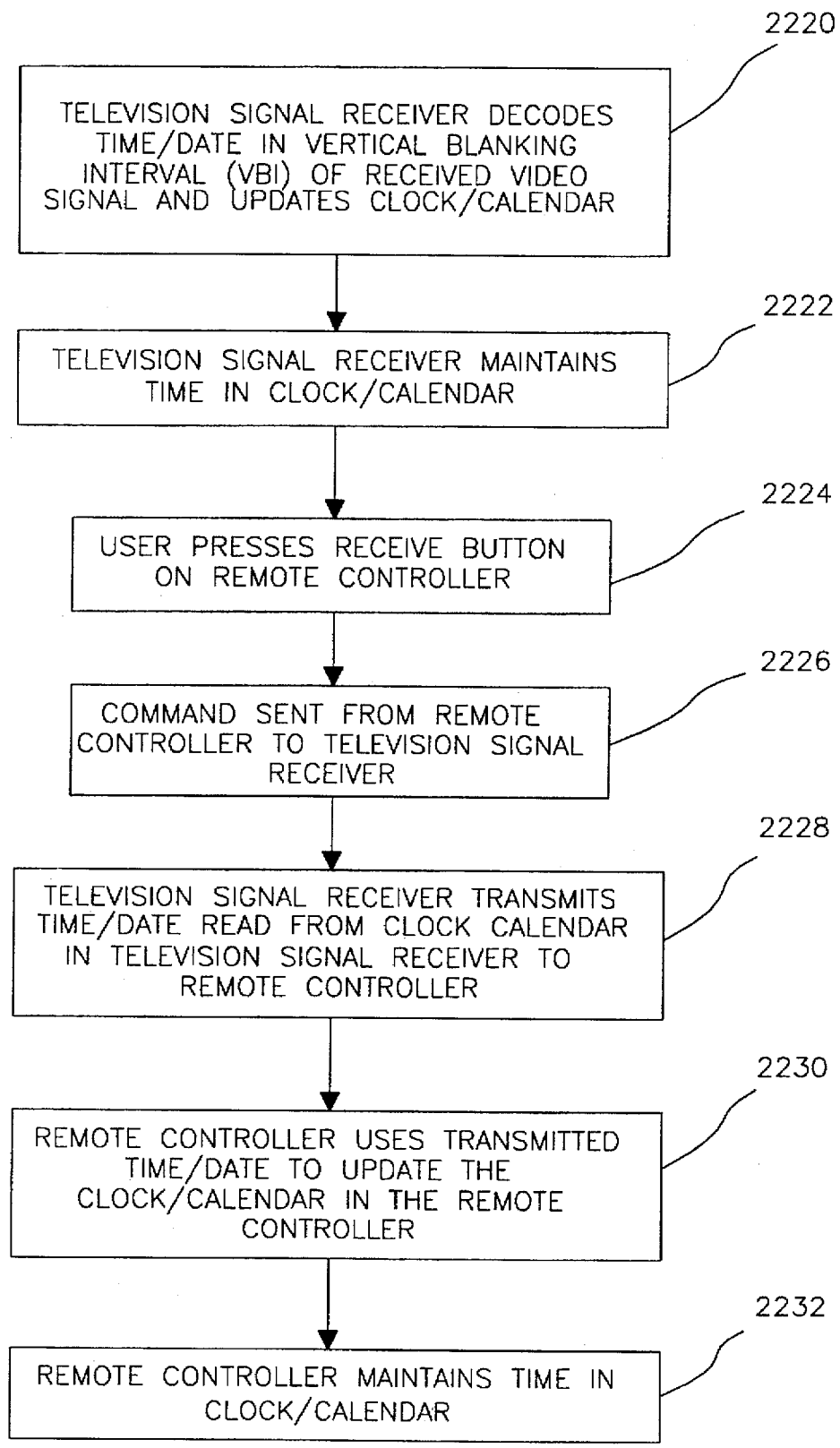

FIG. 1C is a method for updating time in a remote controller via a time obtained from a video signal. In step 2220 a television signal receiver decodes a time and date in a vertical blanking interval (VBI) of a received video signal and updates the clock/calendar to match the decoded time and date. Then in step 2222 the television signal receiver maintains the time in the clock/calendar by using an oscillator in the television signal receiver. Then in step 2224 a user presses a receive button on the remote controller. A command is sent in step 2226 from the remote controller to the television signal receiver. Then in step 2228 the television signal receiver transmits the time and date read from the clock/calendar in the television signal receiver to the remote controller. Then in step 2230 the remote controller uses the transmitted time and date to update the clock/calendar in the remote controller. Finally in step 2232 the remote controller maintains the time in the clock/calendar by using an oscillator in the remote controller.

Figure 1D:
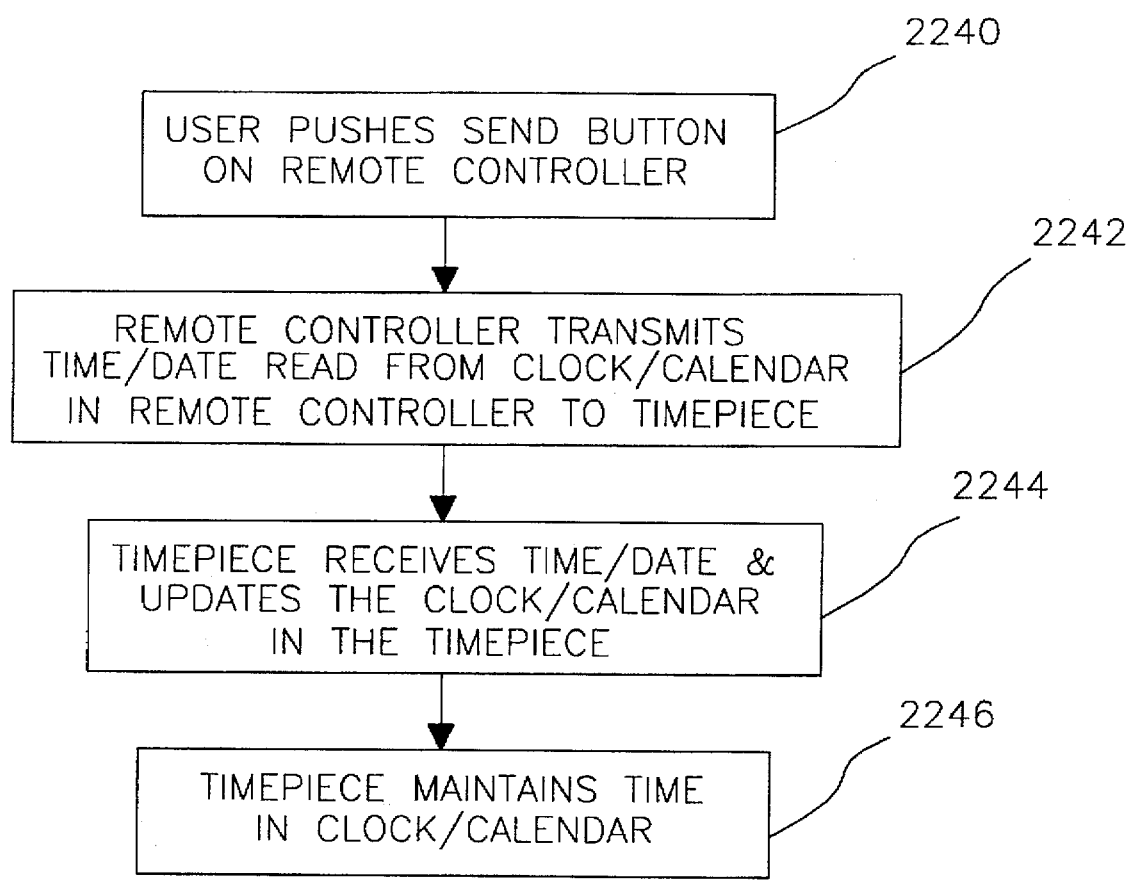

FIG. 1D is a method for updating time on a timepiece from a remote controller. In step 2240, the user presses a send button on the remote controller. Then in step 2242 the remote controller transmits the time and date read from the clock/calendar in the remote controller to the timepiece. The timepiece receives the time and date in step 2244 and updates the clock/calendar in the timepiece. Then in step 2246 the timepiece maintains the time in the clock/calendar by using an oscillator in the timepiece.

Figure 1E:
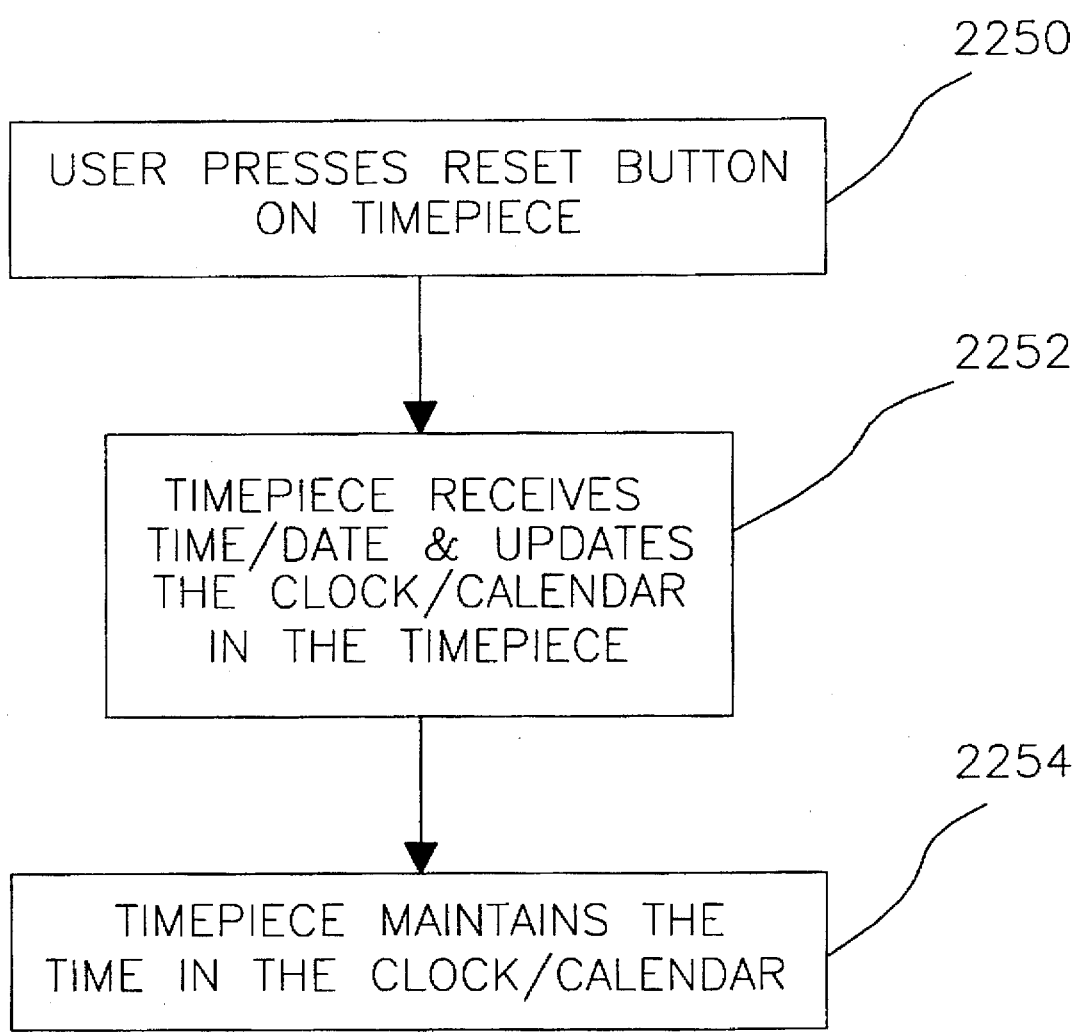

FIG. 1E shows a method for receiving a transmitted time in the timepiece when the timepiece has a reset button for saving power in the timepiece. This method is used for battery driven timepieces such as wrist watches. In step 2250 the user presses a reset button on the timepiece. Then in step 2252 the timepiece receives a time and date and updates the clock/calendar in the timepiece. Then in step 2254 the timepiece maintains the time in the timepiece clock/calendar.

Figure 1F:
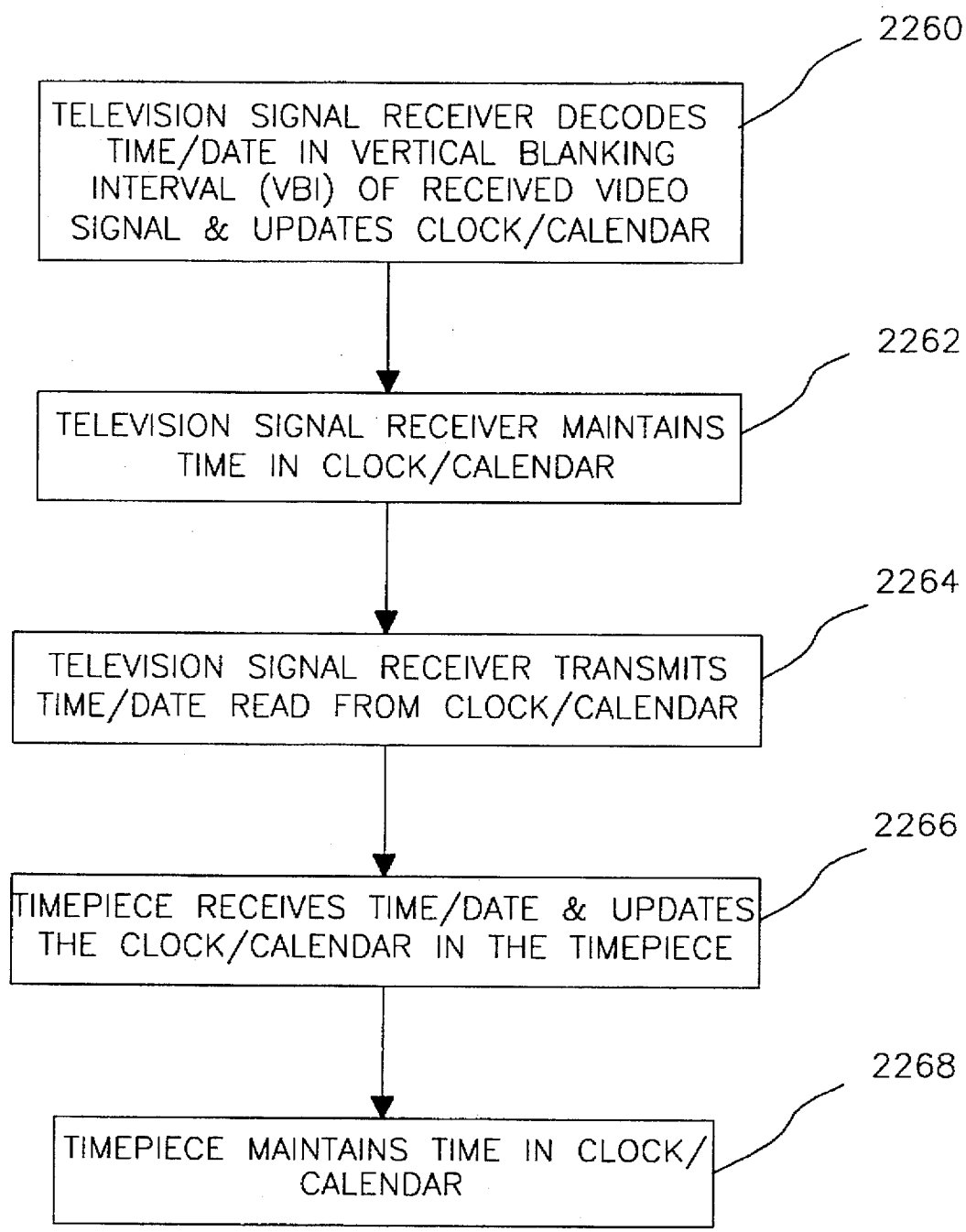

FIG. 1F is a flow diagram of a method for updating time on a timepiece directly from a television signal receiver. In step 2260 a television signal receiver decodes a time and date in the vertical blanking interval of a received video signal and updates a clock/calendar in the television signal receiver to the received time and date. In step 2262 the television signal receiver maintains the time in the clock/calendar in the television signal receiver. Then in step 2264 the television signal receiver transmits the time and date read from the clock/calendar. The transmission of the time and date can be continuous or periodic in order to save power. In step 2266 the timepiece receives the transmitted time and date and updates the clock/calendar in the timepiece to the received time and date. Then in step 2268 the timepiece maintains the time in the timepiece clock/calendar with an oscillator.

Throughout the above-description, time can include a date, as well as the time-of-day.

In the following the use of the vertical blanking interval to send a time and date in a video signal is described. Also described are particular implementations of remote controllers that can be used to implement the remote controller 2000. The downloading of time and date via a telephone to a remote controller is also described.

Video images in a cathode ray tube (CRT) type-video device, e.g. television, are generated by scanning a beam along a predefined pattern of lines across a screen. Each time all the lines are scanned, a frame is said to have been produced. In one implementation, such as used in the United States, a frame is scanned 30 times per second. Each television frame comprises 525 lines which are divided into two separate fields, referred to as field 1 ("odd field") and field 2 ("even field"), of 262.5 lines each. Accordingly, these even and odd fields are transmitted alternately at 60 Hz. The lines of the even and odd fields are interleaved to produce the full 525 line frame once every 1/30 of a second in a process known as interlacing. Another standard in the world uses 625 lines of information and interlace 312 and 313 lines at 50 fields per second. In the 525 line standard used in the United States, approximately 480 lines are displayed on the television screen.

Figure 2A:
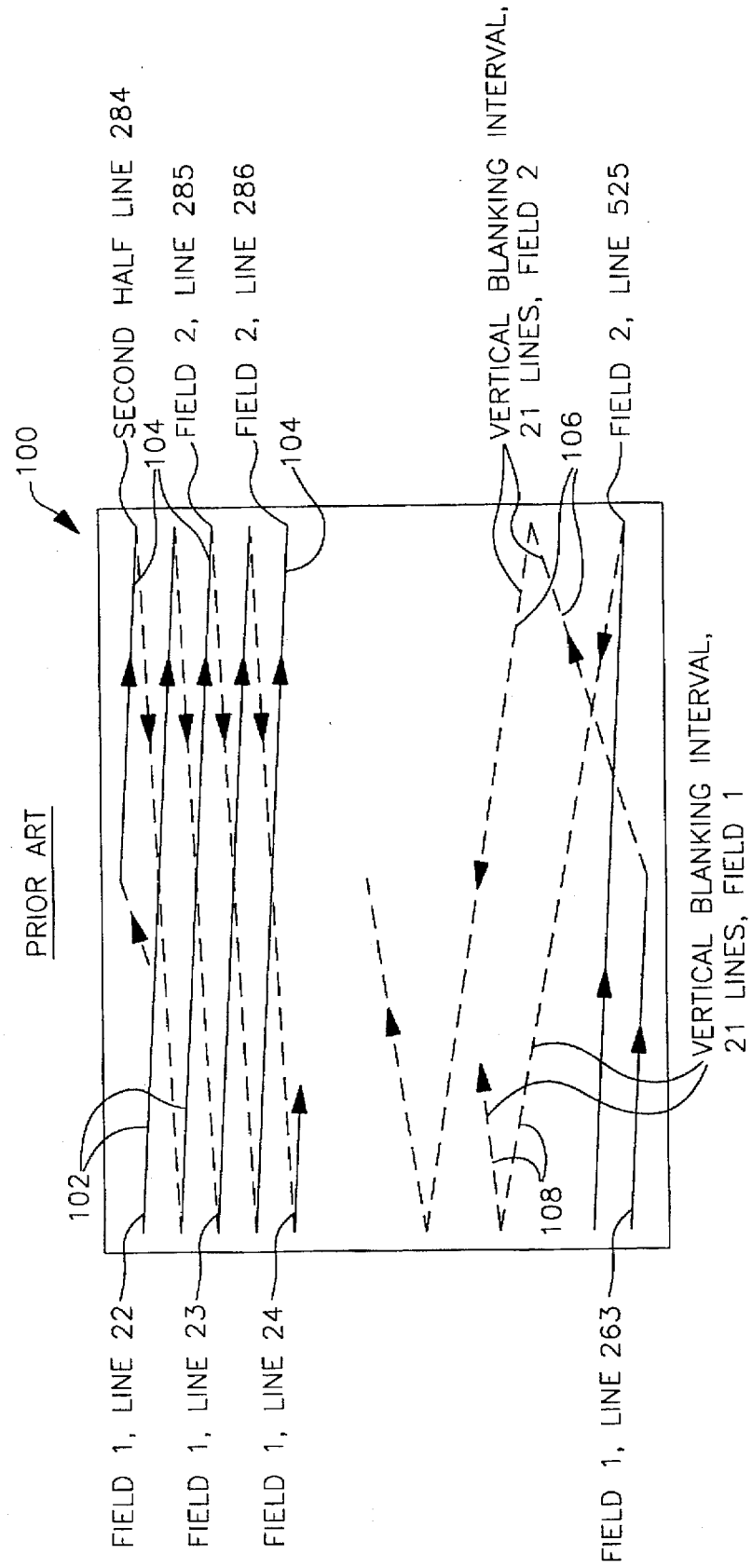
FIG. 2A is a schematic diagram illustrating an interlaced raster scanning pattern of a conventional television.

Referring now to the drawings, FIG. 2A is a schematic diagram illustrating the interlaced scanning pattern 100 on a screen of a conventional television receiver. A video display scans the beam from the top left hand corner and scans across the screen (line 22, field 1 in FIG. 2A). After it finishes scanning the first line, the beam returns to the left hand side during a period known as a horizontal blanking interval and repeats scanning along another line which is parallel to but lower than the previous line (line 23, field 1 in FIG. 2A). The scanning continues along the lines until the beam reaches the center of the bottom part of the screen (line 263, field 1) to complete field 1, which is comprised of lines 102.

From the bottom center of the screen, the beam returns to the top where it starts scanning from substantially the center of the screen along the lines 104 for field 2 which interlace the lines of field 1. This is not an instantaneous bottom to top jump but actually requires the length of time to scan 21 horizontal lines. These lines 106 are lines 1 through 21 of field 2. The second half of line 21 field two (line 284 as shown in FIG. 2A) is displayed. Then lines 285 to 525 of field 2 are scanned to complete field 2. When the beam reaches the bottom, right hand corner of the screen, the picture frame is formed. Then the beam retraces to the top and the vertical blanking interval lines 108 are numbered 1 through 21 of field 1. In the NTSC protocol widely used in North America, each field contains 262.5 horizontal lines and a pair of fields constitute a single 525 line video frame and creates one video picture at one instant in time on the video display.

During the time in which the beam returns from the bottom to the top of the screen between the fields, it carries no video or picture signals because it does not produce any picture element on the screen. This time interval is generally known as the vertical blanking interval (VBI). Its duration is typically 21 times the time duration that it takes the beam to scan across the screen. In other words, the duration of the VBI is equal to the time for the beam to scan 21 lines and is divided into 21 lines. In interlaced scanning, the VBI is identified by the field with which it is associated. Apparatus and methods using the NTSC standard with 21 lines in each VBI are well known in the art and therefore are not discussed in detail herein.

Figure 2B:
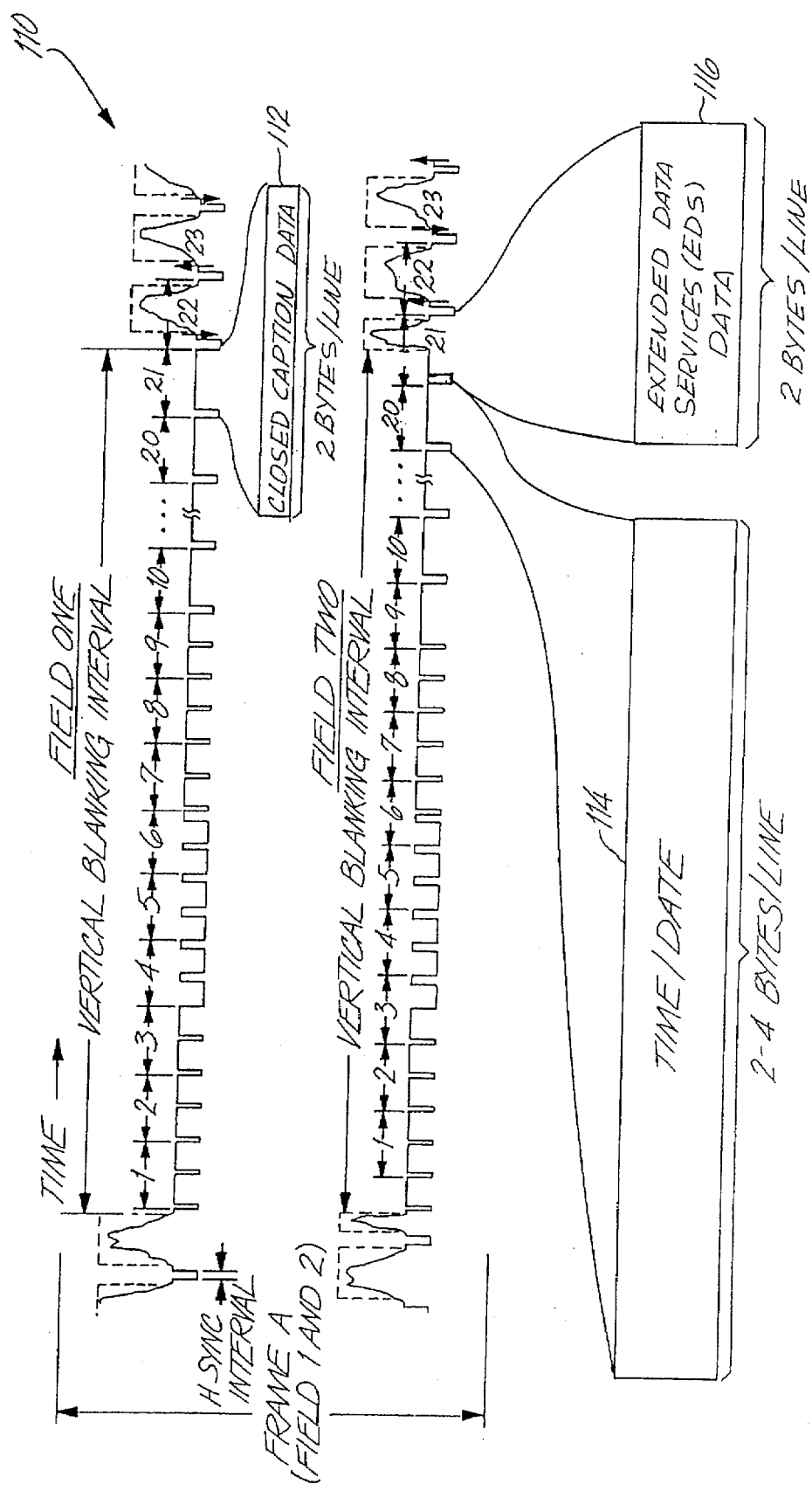
FIG. 2B is a timing diagram showing the vertical blanking interval (VBI) lines of field 1 and field 2.

Because no image is produced on the display during the vertical blanking interval, no picture information therefore needs to be carried by the broadcast signals. Thus, the VBI is used for conveying auxiliary information from a television network or station to an audience. For example, closed caption data associated with the television program are transmitted as encoded composite data signals in VBI line 21, field 1 of the standard NTSC video signal, as shown in FIG. 2B.

Lines 1 through 9 of the VBI of each field are used for vertical synchronization and post equalizing pulses. Thus, lines 10 through 21 are available for auxiliary information.

Figure 3:
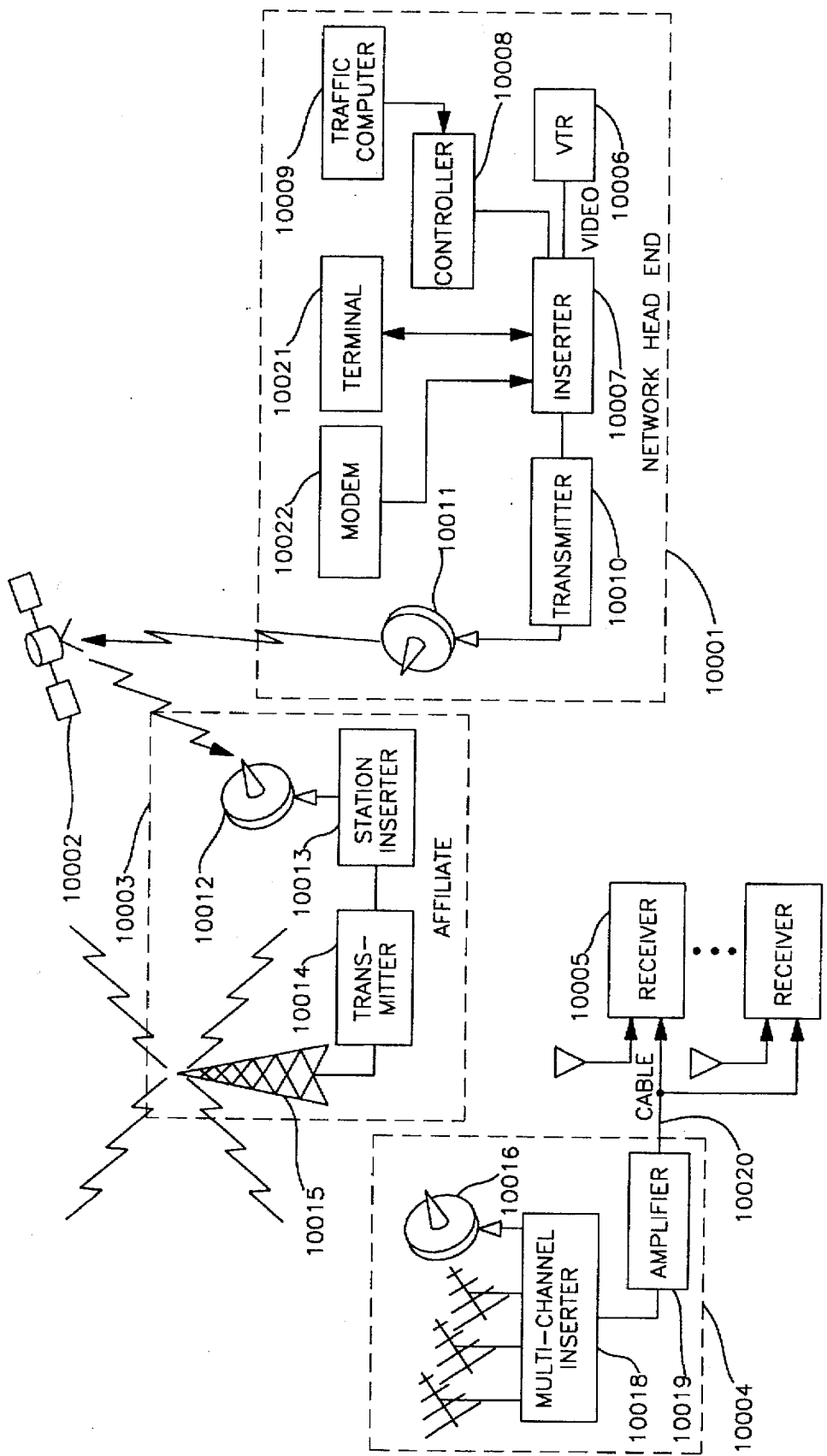
FIG. 3 is a functional block diagram of a television video and data transmission system.

FIG. 3 is a functional block diagram of a data transmission system. As used herein, the terms "broadcast" and "transmit" are used interchangeably for the transmission of signals over cable or fiber optics, to or from satellites, over the air, and the like. A network head end 10001 transmits a composite television signal containing inserted information in a portion thereof, typically the vertical blanking interval (described above in conjunction with FIG. 2A), to a satellite 10002 which rebroadcasts the same to a local affiliate 10003. The affiliate 10003 may further insert data into the vertical blanking interval of the received television signal and transmit the same to a local cable head end 10004. The cable head end 10004 receives television signals from a plurality of sources (including satellites) and may further insert data into the vertical blanking interval of any of the television signals. The signals from the plurality of sources are combined into a composite television signal, amplified, and provided over a cable to a plurality of individual receivers 10005, which can include televisions, cable boxes, VCRs and satellite receivers. In addition, the individual receivers 10005 may receive signals directly from the local affiliate 10003 by air, which may include the use of a satellite 10002, or by cable.

More specifically, the network head end has a video tape recorder (VTR) 10006 for providing a program signal to an inserter 10007. A controller 10008 also at the head end controls the scheduling of loading tapes from a cart (a machine with a plurality of video tape cassettes which are moved by a robotic arm from a storage location and inserted into a video tape recorder and vice versa). Furthermore, the controller 10008 controls the lighting of stages during live broadcasts, such as news broadcasts. The controller 10008 is typically a microprocessor based system. A traffic computer 10009 controls the exact timing of playing individual segments of video tapes and inserting commercials therebetween as well as switching between different programs. Some network head ends have both a traffic computer 10009 and a controller 10008. The controller 10008 provides data and commands to the inserter 10007. The traffic computer 10009 provides data and commands to the controller is present. Otherwise, the traffic computer 10009 provides these signals directly to the inserter 10007. The inserter 10007 inserts data into the vertical blanking interval of the composite television signal, as will be described below, and provides the television signal to a transmitter 10010 which in turn provides the television signal on a microwave carrier to a satellite dish 10011 for transmission to the satellite 10002.

The satellite 10002 retransmits the received signal, which is received by a satellite dish 10012 at the affiliate 10003. The dish provides the signal to a station inserter 10013 at the local affiliate 10003. The affiliate may also insert data into the composite television signal as will be described below. The television signal is then provided to a transmitter 10014 and then to a transmitting antenna 10015.

A local cable operator 10004 has a plurality of satellite dishes 10016 and antennas 10017 for receiving signals from a plurality of networks 10001 and affiliates 10003. The received signal from each of the dishes 10016 and antennas 10017 is provided to a respective input of a multi-channel inserter 10018, which can input data into the vertical blanking interval of a received signal. The multi-channel output from the inserter 10018 is amplified in an amplifier 10019 and provided over a cable 10020 to individual receivers 10005. Alternately the receivers 10005 could receive broadcast information via antennas or satellite receivers.

Each receiver 10005 includes a VBI decoder, which can include a VBI slicer and closed caption decoder, that scans VBI lines 10–21 of both fields 1 and 2. In addition it is possible to use the first few visible lines in each video frame for VBI data, for example, lines 22–24. Lines 1 through 9 are typically used for vertical synchronization and equalization and, thus, are not used to transmit data. Closed captioning and text mode data are generally transmitted on VBI line 21, field 1 of the standard NTSC video signal, at a rate of 2 bytes for each VBI line 21, field 1, as shown by closed caption data 112 in FIG. 2B. The text mode fields fill the entire screen with text. The default mode is an open ended mode in which the page is first filled up and then scrolled up. The individual recipient of such data has no control over the data. Extended data services (EDS) data can be transmitted on VBI line 21, field 2, as shown by EDS data 116 in FIG. 2B, at a rate of 2 bytes per VBI line 21, field 2.

By way of background, the data in the vertical blanking interval can be described in terms of the wave form, its coding and the data packet. The closed caption data wave form has a clock run-in followed by a frame code, followed by the data. The coding of the data is non-return-to-zero (NRZ) 7 bit odd parity.

Under mandatory FCC requirements effective July 1993, color televisions having a size 13" and greater must provide a closed caption decoder. Caption data decoding is further described in the following specifications, which are hereby incorporated by reference herein: Title 47, Code of Federal Regulations, Part 15 as amended by GEN. Docket No. 91-1; FCC 91-119; "CLOSED CAPTION DECODER REQUIREMENTS FOR THE TELEVISION RECEIVERS"; Title 47, C.F.R., Part 73.682 (a) (22), Caption Transmission format; Title 47, C.F.R. Part 73.699, FIG. 6; "TELEVISION SYNCHRONIZING WAVE FORM"; Title 47, C.F.R., Part 73.699, FIG. 17a; "LINE 21, FIELD 1 DATA SIGNAL FORMAT"; and PBS Engineering Report No. E-7709-C, "TELEVISION CAPTIONING FOR THE DEAF: SIGNAL AND DISPLAY SPECIFICATIONS".

Under the extended data services (EDS) proposed in the *Recommended Practice for Line 21 Data Service*, Electronics Industries Association, EIA-608 (drafts Oct. 12, 1992 and Jun. 17, 1993) (hereinafter referred to as "EIA-608" standard"), the subject matter of which is incorporated herein by reference, additional data is provided in line 21, field 2 of the vertical blanking interval. This recommended practice includes two closed captioning fields, two text mode fields and the extended data services. Table 1 shows the classification of data, the class control code, and the type code. The extended data includes, among other information, program name, program length, length into show, channel number, network affiliation, station call letters, UCT (universal coordinated time) time, time zone, and daylight savings time usage. Upstream at the network, the network inserts the program name, the length of the show, the length into the show, the network affiliation, and the UCT time. Downstream at the affiliate, the affiliate inserts the channel number, the time zone, the daylight savings time usage and program names. The network inserts the data that does not differ for different affiliates.

The data is transmitted in packets. Six classes of packets are proposed in the EIA-608 standard, including: (1) a "Current" class for describing a program currently being transmitted; (2) a "Future" class for describing a program to be transmitted later; (3) a "Channel Information" class for describing non-program specific information about the transmitting channel; (4) a "Miscellaneous" class for describing other information; (5) a "Public Service" class for transmitting data or messages of a public service nature such as National Weather Service Warnings and messages; and (6) a "Reserved" class reserved for future definition.

According to the proposed EIA-608 standard, a packet is preceded by a Start/Type character pair, followed by information/informational characters pairs until all the informational characters in the packet have been sent.

Table 1 lists a subset of the control and type codes of various kinds of information to be broadcasted in the VBI according to the EIA-608 standard. For example, to transmit the program identification number (scheduled start time) of a program, a control code of 01, 02 hex, a type code of 01 hex and a packet of four characters (one character specifying the minute, one character specifying the hour, one character specifying the date and one character specifying the month) are sent. Similarly, to transmit the program name, a control code of 01, 02 hex, a type code of 03 hex, and a packet of between 2 to 32 characters are sent. As another example, the VBI may also be used to transmit a time-of-day value, by sending a control code of 07, 08 hex, a type code of 01 hex, and a packet of two characters. The inserter 10007 stores data from the video stream and handles the insertion of such data into the video stream.

TABLE 1

| Class | Class Control Code | Type |
|---|---|---|
| Current Class | | |
| Program Identification (scheduled start time) | 01 hex, 02 hex | 01 hex |
| Length/Time-in-show | 01 hex, 02 hex | 02 hex |
| Program Name | 01 hex, 02 hex | 03 hex |
| Program Type | 01 hex, 02 hex | 04 hex |
| Program Rating | 01 hex, 02 hex | 05 hex |
| Audio Services | 01 hex, 02 hex | 06 hex |
| Caption Services | 01 hex, 02 hex | 07 hex |
| Current Class | | |
| Aspect Ratio Information | 01 hex 02 hex | 09 hex |
| Composite Packet - 1 | 01 hex, 02 hex | 0C hex |
| Composite Packet - 2 | 01 hex, 02 hex | 0D hex |
| Program Description row 1 to 8 | 01 hex, 02 hex | 10 hex - 17 hex |
| Channel Information Class | | |
| Network Name (affiliation) | 05 hex, 06 hex | 01 hex |
| Call Letters (Station ID) and Native Channel | 05 hex, 06 hex | 02 hex |
| Tape Delay | 05 hex, 06 hex | 03 hex |
| Miscellaneous | | |
| Time-of-Day | 07 hex, 08 hex | 01 hex |
| Impulse Capture ID | 07 hex, 08 hex | 02 hex |
| Supplemental Data Location | 07 hex, 08 hex | 03 hex |
| Local Time Zone & DST Use | 07 hex, 08 hex | 04 hex |
| Public Service Class | | |
| National Weather Service Code | 09 hex, 0A hex | 01 hex |
| National Weather Service Message | 09 hex, 0A hex | 02 hex |

The data inserted into the television signal by the inserter includes closed captioning data and EDS data. The station inserted data can include data such as a channel specific program guide (CSPG), program related information (PRI), supplemental text, and a VM packet which is a data packet used for triggering and control and which are described in U.S. patent application Ser. No. 08/176,852, filed Dec. 30, 1993 which is incorporated herein by this reference as though set forth in full. The traffic computer 10009 provides bare bone time and title information automatically to the inserter for creating a channel specific program guide. The data can also include time and date data. The data can be inserted into either or both fields in any VBI line between 10 and 20. For example the data can be inserted into line 20 of field 2, as shown by the time and date data 114 in FIG. 2B. The data may be inserted into the VBI at the closed caption rate (1X format) or at two times the closed caption rate (2X format), which is further explained below.

The data may be manually entered from a local terminal 10021. The local terminal 10021 may be used to pre-build, recall, or edit messages. The terminal 10021 typically includes a computer. In addition, a modem 10022 may be used to provide data to the inserter 10007. The data may be provided manually or automatically from remote sites, such as a television program guide publisher or the network head end. The output of the inserter 10007 is a composite television signal with the data inserted. This system processes both teletext data (which is not related to the program) and auxiliary information (which is related to the program).

The timing of video signals in NTSC format is well known in the art. As described above, the vertical blanking interval is the time between the flyback from the bottom of the screen to the top of the screen. Although no video signal is displayed, the horizontal synchronization pulses are still provided during the VBI. The standard data transmission rate is defined in the EIA-608 standard.

As shown in FIG. 4, the horizontal synchronization pulse 120 is followed by color burst signals 122. For closed caption and EDS data, a clock run-in cycle 124 follows the color burst which in turn is followed by a frame code 126. The clock run-in is "10101010101." The frame code is "01000011." Two data bytes 128 and 130 are transmitted in each VBI line. Each byte is 8 bits including a parity bit. This format is referred to as the standard data rate format (or 1X format). Each byte in the VBI line is arranged with the least significant byte first. The last bit is used as parity for error checking. Each byte of the transmitted data is parity checked upon receipt. The 1X format is the format used to transmit closed captions in VBI line 21 field 1, as shown by closed caption data 112 in FIG. 2B. It is also the format used to transmit EDS data in VBI line 21 field 2, as shown by EDS data 116 in FIG. 2B.

An accelerated data format (2X format) as shown in FIG. 5 uses a bit rate twice that of the 1X format to thereby provide 4 bytes per VBI line. The clock run-in 144 is the bit sequence "10101010." The frame code 146 is "10011101101." Four data bytes 148, 150, 152 and 154 are transmitted each VBI line. The 2X format can be used to transmit time and date data 114 in FIG. 2B.

Figure 6A:
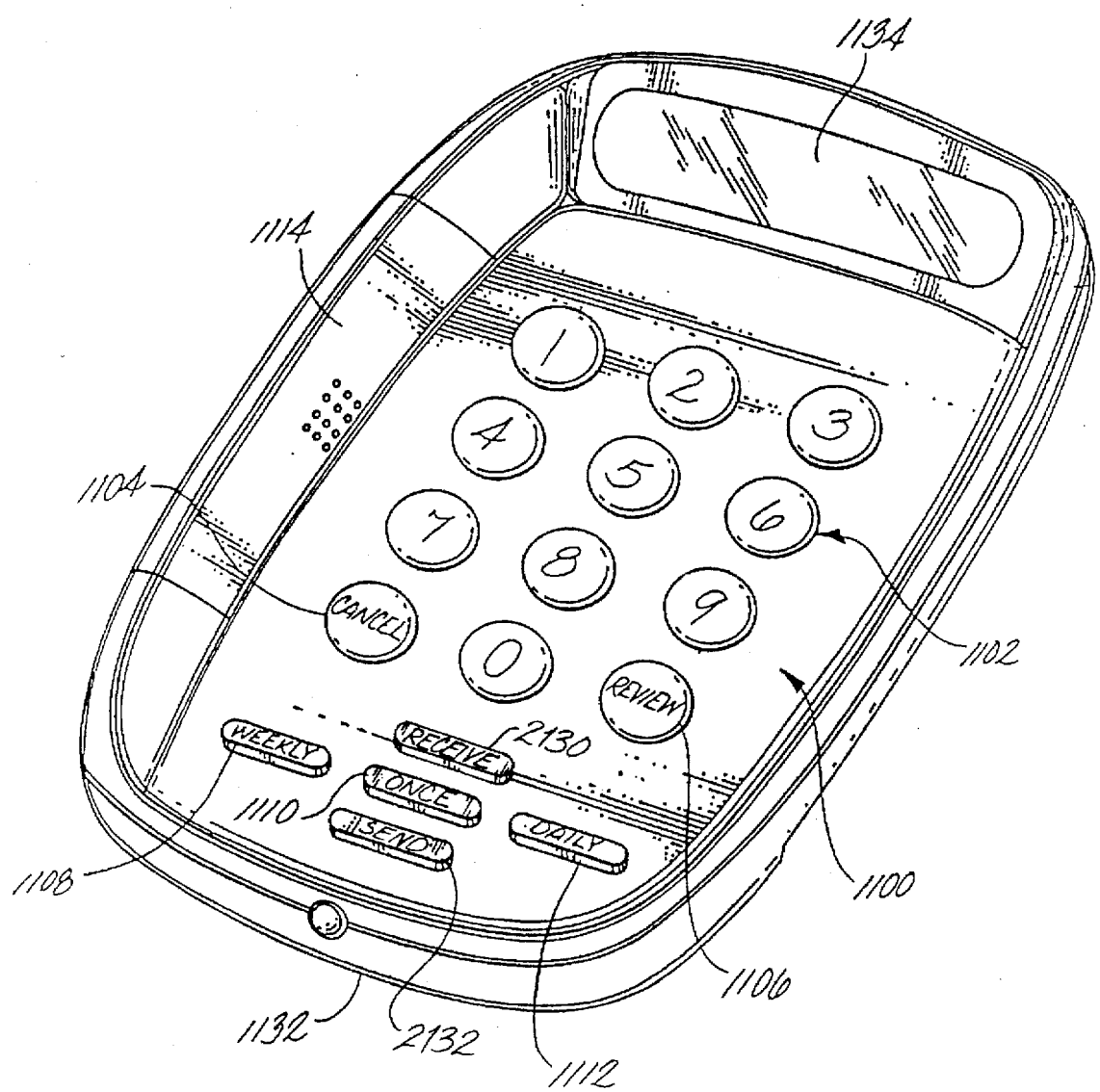
FIG. 6A is a perspective view of a remote control apparatus for setting clocks according to an embodiment of the invention.
Figure 7:
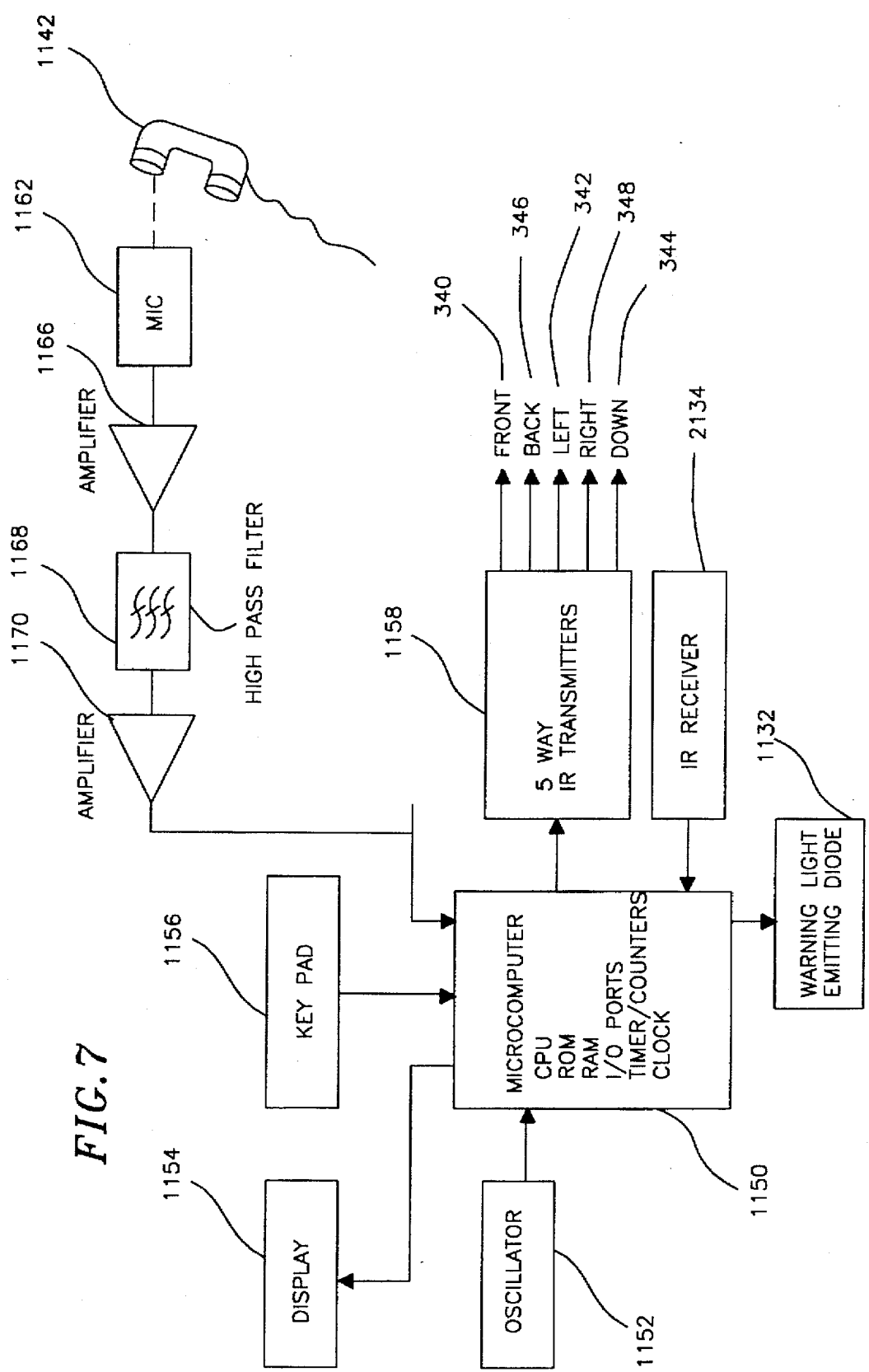
FIG. 7 is a schematic showing apparatus connected for downloading information via a telephone according to an embodiment of the invention.

FIG. 6A is a perspective view of a remote control apparatus for setting clocks, which is called a custom programmer 1100. The keypad includes RECEIVE button 2130 and SEND button 2132, which operate in the same manner as RECEIVE button 2036 and SEND button 2034 of FIG. 1. The other elements of remote controller 2000, shown in FIG. 1, are contained in the custom controller 1100, as shown in the schematic of FIG. 7.

The other purpose of the custom programmer is to significantly reduce the number of keystrokes required to set up the timer preprogramming feature on a VCR. It is only necessary for the user to enter a code with 1 to 8 digits or more into the VCR. This can be done either remotely or locally at the VCR. Built into either the custom programmer is a decoder which automatically converts the code into the proper channel, day, time-of-day, and length (CDTL) programming information and activates the VCR to record a given television program with the corresponding channel, date, time and length. Generally multiple codes can be entered at one time for multiple program selections. The code can be printed in a television program guide in advance and selected for use with a VCR or remote controller with the decoding means.

A product embodying these features is now commercially available and has enjoyed great commercial success. This instant programmer, sold under the VCRPlus+® trademark, consists of a hand-held unit into which compressed codes (each 1 to 8 digits long) for television programs to be recorded are entered. The compressed codes are most commonly found in printed television listings. The instant programmer decodes the compressed codes into channel, date, time-of-day and length commands which are then stored in the programmer's memory. When date and time of the program in the memory that is scheduled the nearest to the current time coincides with the current time, as determined by an internal clock, the instant programmer, using an IR transmitter and universal remote technology, sends IR remote control signals to a cable box or a video recorder to change the channel to the correct channel and IR remote control signals to a video recorder to turn the recorder on and begin recording. After the length for the program, stored in memory, has elapsed, an IR remote control signal to stop recording is sent to the video recorder.

The custom programmer 1100 has number keys 1102, which are numbered 0–9, a CANCEL key 1104, a REVIEW key 1106, a WEEKLY key 1108, a ONCE key 1110, and a DAILY (M–F) key 1112, which are used to program the custom programmer 1100. As described above the custom programmer 1100 also has a RECEIVE key 2130 and a SEND key 2132. A lid normally covers other keys, which are used to setup the custom programmer 1100. When lid 1114 is lifted, the following keys are revealed, but not shown in the drawings: SAVE key, ENTER key, CLOCK key, CH key, ADD TIME key, VCR key, CABLE key, and TEST key. Also included in the custom programmer 1100 shown in FIG. 40 are: liquid crystal display 1134, red warning light emitting diode 1132 and IR diodes 1134.

When using the custom programmer 1100, the consumer initially performs a set-up sequence, consisting of selecting a protocol for the model/brand of VCR, setting the current real time, selecting a protocol for the model/brand of cable box, and entering a series of channel number assignments. This initial set-up sequence for the custom programmer 1100 is somewhat complex and may deter the use of the custom programmer by some consumers.

To relieve the complexity of manually performing initial set-up for the custom programmer, custom programmer 1100 includes a microphone opening 1140 through which a microphone inside the custom programmer 1100 can receive coded audio signals that contain the information necessary for the custom programmer's initial set-up and commands to store this information into the custom programmer 1100. Information downloaded through the microphone can include time and date data, as well as, information for performing timer preprogramming of a VCR.

In order to receive these audio signals, a user may call a special phone number which could be a toll-free 800 number, a pay-per-minute 900 number, or a standard telephone number with standard toll charges applying. The consumer can speak to an operator or could respond to questions from a computerized system by pressing keys on the phone to send data back to the computer. A computerized system that responds to touch tones is the preferred way to download time and date data to the custom programmer.

For the timer preprogramming functions the operator or computer is given data regarding the consumer's VCR model and brand, zip code, model and brand of cable box and the newspaper or other publication which the consumer will use to obtain the compressed codes. This is all the information needed to perform the initial set-up for the custom programmer 1100. From the zip code information, the operator can determine to which cable system the consumer is connected and can combine this data with the knowledge of which publication the consumer will use to select the correct local channel mapping table for the consumer.

The operator or computer then directs the consumer to press a designated programming key which is, in the case of the preferred embodiment, the CH key located under lid 1114. When the CH key is pressed, the display 1134 with display the message "PHONE1 KEY2. Pressing the "2" numeric key places the custom programmer into the manual set-up mode. Pressing the "1" numeric key initiates the remote programming mode. The custom programmer 1100 is then ready to receive an audio signal and display 1134 displays the message "WAIT".

Figure 6B:
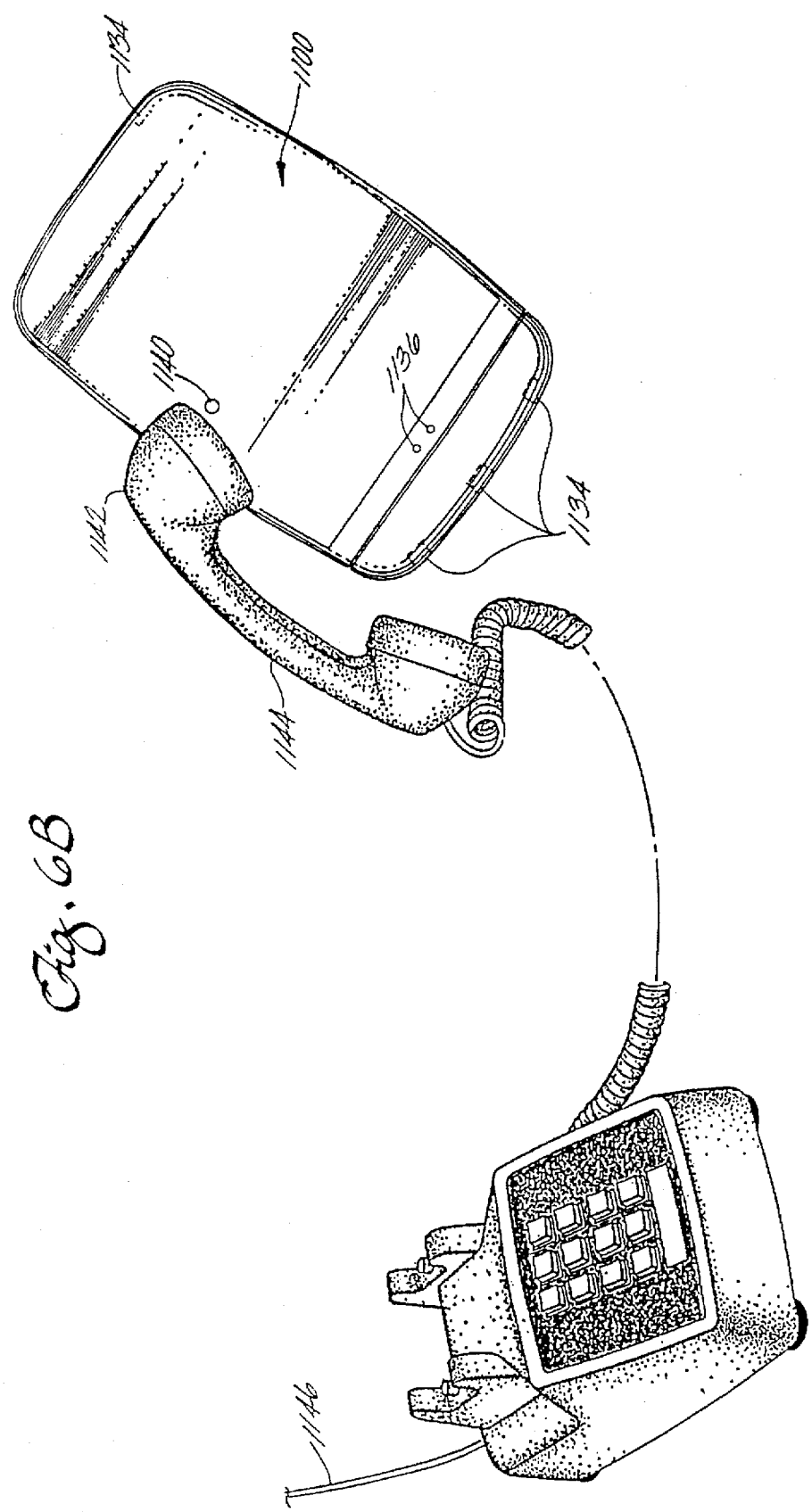
FIG. 6B shows the apparatus of FIG. 6A being used in conjunction with a telephone according to an embodiment of the invention.

The operator or computer will then direct the consumer to place the earpiece 1142 of the telephone receiver 1144 over the microphone opening 1140 of the custom programmer 1100 as generally shown in FIG. 6B. The earpiece need not be placed directly against the custom programmer 1100, but may be held more than an inch away from the microphone opening with generally satisfactory results. After a pause sufficient to allow the consumer to place the telephone receiver in the proper position, the operator will initiate the downloading of the initial set-up data and initial set-up programming commands transmitted over the telephone line 1146 using audio signals to the consumer's custom programmer 1100.

If the initial set-up data is successfully transferred to the custom programmer 1100, the display 1134 of the custom programmer 1100 will display the message "DONE". If the reception of the initial set-up data is not successful within a predetermined time limit, red warning light emitting diode 1132 will blink to inform the consumer to adjust the position of the telephone earpiece before another down load of the information is attempted. After a waiting period allowing this adjustment, the initial set-up data and commands are re-transmitted over the telephone line. If after a predetermined number of attempts to download the initial set-up information are unsuccessful, the liquid crystal display 1134 displays the message "FAIL" and the operator is again connected to the consumer allowing the operator to speak to the consumer to provide additional assistance in the positioning of the telephone earpiece.

This same faulty download warning is given to the consumer if the time and date data are improperly downloaded.

If local cable companies supply the live operators, the only information they would need to gather from the consumer for the timer preprogramming function would be the VCR brand and model and the publication containing compressed codes that the consumer plans on using, because the local cable company would know the model and brand of cable box installed at the consumer's location and the necessary data regarding the local channel designations for that cable system.

FIG. 7 is a schematic of the circuitry needed to implement alternative embodiments of the custom programmer 1100. The circuit consists of microcomputer 1150, oscillator 1152, liquid crystal display 1154, keypad 1156, five way IR transmitters 1158 and red warning light emitting diode 1132. Also included is IR receiver 2134. The IR transmitters 1158 are used to send commands to appliances, such as a VCR. The IR transmitters 1158 are also used along with the IR receiver 2134 to communicate with the receiver 10005 shown in FIGS. 1 and 3, which could be a television, VCR, cable box, or satellite receiver. In FIG. 7, earpiece 1142 generates audio signals which are received by microphone 1162. As shown, the audio signals received by microphone 1162 are passed through amplifier 1166, through a band pass filter 1168 with a cutoff at approximately 1–4 kHz, and through a second amplifier 1170 to a serial port of microcomputer 1150.

Figure 8:
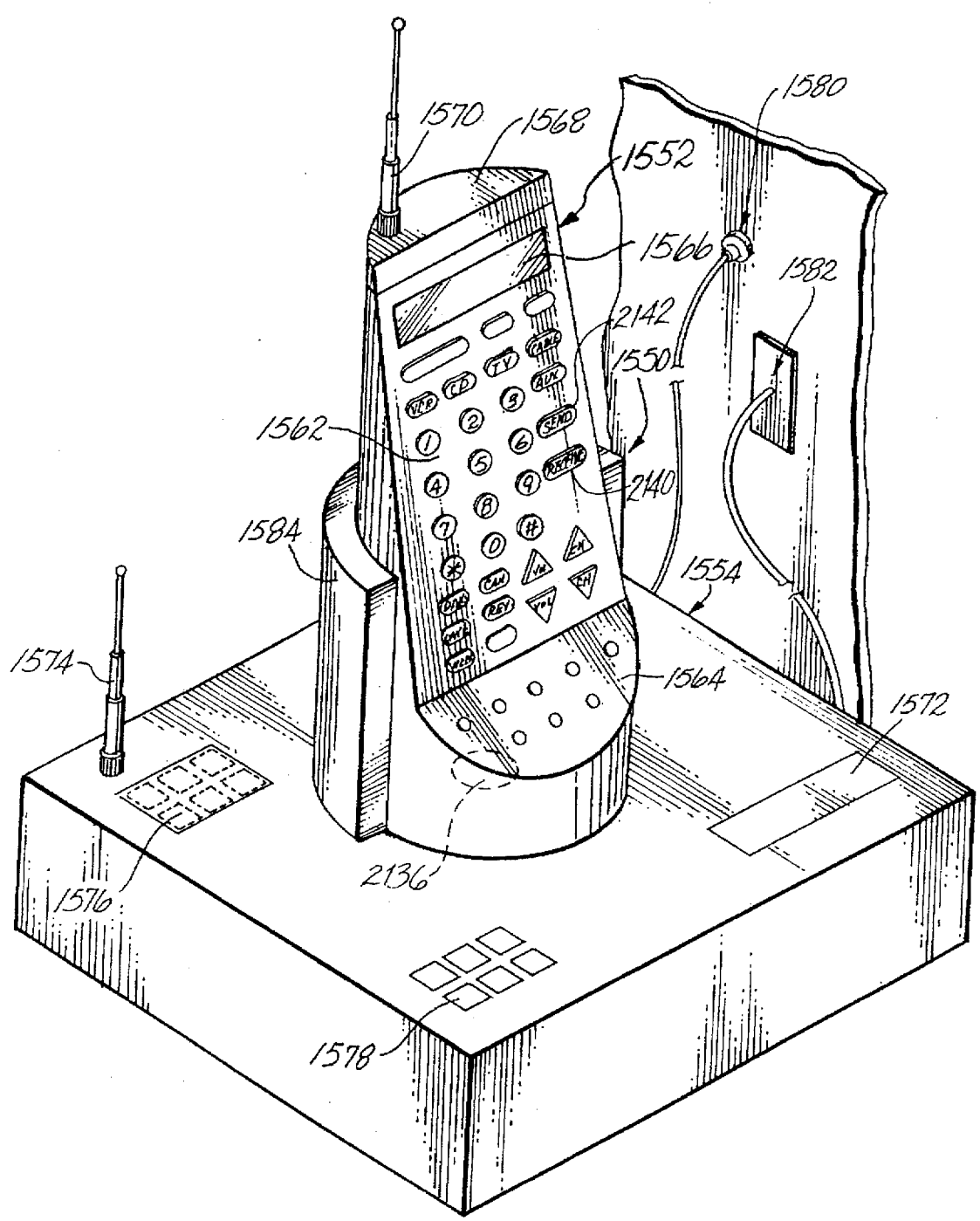
FIG. 8 is a perspective view of a telephone set having a cordless telephone including an universal remote controller mounted in a telephone base unit according to an embodiment of the invention.

In the embodiment shown in FIG. 8, the functional elements of the custom programmer 1100 are embedded within a telephone set 1550, which includes a telephone base unit 1554 with RF communication to a cordless telephone 1552. The telephone set can perform all of the compressed code decoding and VCR programming functions of the custom programmer. In addition the telephone set and specifically the cordless telephone 1552 can operate as an universal remote controller for controlling appliances such as televisions, cable boxes, VCRs and satellite receivers. The other function of the telephone set 1550 is to set clocks by transmitting time and date information to the clocks in the manner shown in FIG. 1.

In the embodiment shown in FIG. 8, no microphone 1140, as shown in FIG. 6B, for downloading information from a telephone receiver is required for the telephone base unit 1554, because the telephone base unit 1554 is connected directly to the telephone network, as shown by telephone connection 1582, and the telephone set. The telephone connection is to a telephone network, and the connection can be via telephone lines or via a cellular network. The telephone base unit 1554 can hold the cordless telephone 1552 and also charge the batteries of the cordless telephone.

A telephone set that does not include a cordless telephone is another embodiment that is not shown, but such a telephone set operates very similarly to the description that follows for the telephone base unit except there would not be a cordless telephone or an RF link to the cordless telephone.

Another embodiment is a telephone similar to cordless telephone 1552 that is a cellular phone. For this embodiment, the telephone base unit 1554 is not needed, because the cellular phone can directly connect via the cellular network to the telephone network.

Yet another embodiment is a unit similar to cordless telephone 1552 that is a universal remote controller, but does not have a telephone function. In this embodiment, a microphone 2136, shown in FIG. 8, which has the same function as microphone 1140 in FIG. 6B for downloading information from a telephone receiver, is required. For this embodiment no telephone base unit 1554 is needed and the microphone would be used to download information from any telephone receiver.

In the following description, only the telephone set embodiment is described, but the universal remote control, and timer preprogramming, and clock setting features are the same for all the embodiments.

The cordless telephone 1552, as shown in FIG. 8, includes controls 1562 and controls 1564 which provide the controls of custom programmer 1100 and also the controls required for a universal remote controller, such as channel and volume up and down keys and VCR, CD, TV, CABLE and AUX select buttons. The keypad also includes RECEIVE button 2140 and SEND button 2142, which operate in the same manner as RECEIVE button 2036 and SEND button 2034 of FIG. 1. The cordless telephone includes a display 1566 corresponding to display 1134 of custom programmer 1100. An antenna 1570 is included on the cordless telephone to provide a RF link to the telephone base unit. An IR transparent cover 1568 covers an IR transmitter and also an IR receiver.

The telephone base unit 1554 includes controls 1578 and 1576 which correspond to the controls 1562 and 1564 on the cordless telephone. The telephone base unit also includes antenna 1574 for providing an RF link to the cordless telephone 1552. The telephone base unit can also contain a display 1572 corresponding to display 1566 on the cordless telephone. The telephone base unit can have a direct wall power connection 1580 and be connected directly to the telephone line via connection 1582. Alternatively, the connection to the telephone network can be via a cellular network. Various designs of the telephone base unit and the cordless telephone are possible. FIG. 8 shows one possible design in which the telephone base unit 1554 has a semi-circular tower 1584 that is designed to hold the cordless telephone 1552. The tower 1584 also has the function of providing an elevated tower for holding IR transmitters and an IR receiver.

IR transmitters can be located around the top of the tower pointing in an upward direction, a right direction, a left direction, a rear direction and a forward direction. The multiple IR transmitters insure that the telephone base unit will communicate properly with the appliances to be controlled regardless of the orientation of the telephone unit with respect to those units. IR receivers can be placed at the top of the tower 1584 for receiving information from the appliances, such as the time and date from receiver 10005, shown in FIG. 1.

In this application the term appliances and the term devices include televisions, cable boxes, satellite receivers, VCRs, and other similar equipment, including any remote controller for the various apparatus.

Figure 9:
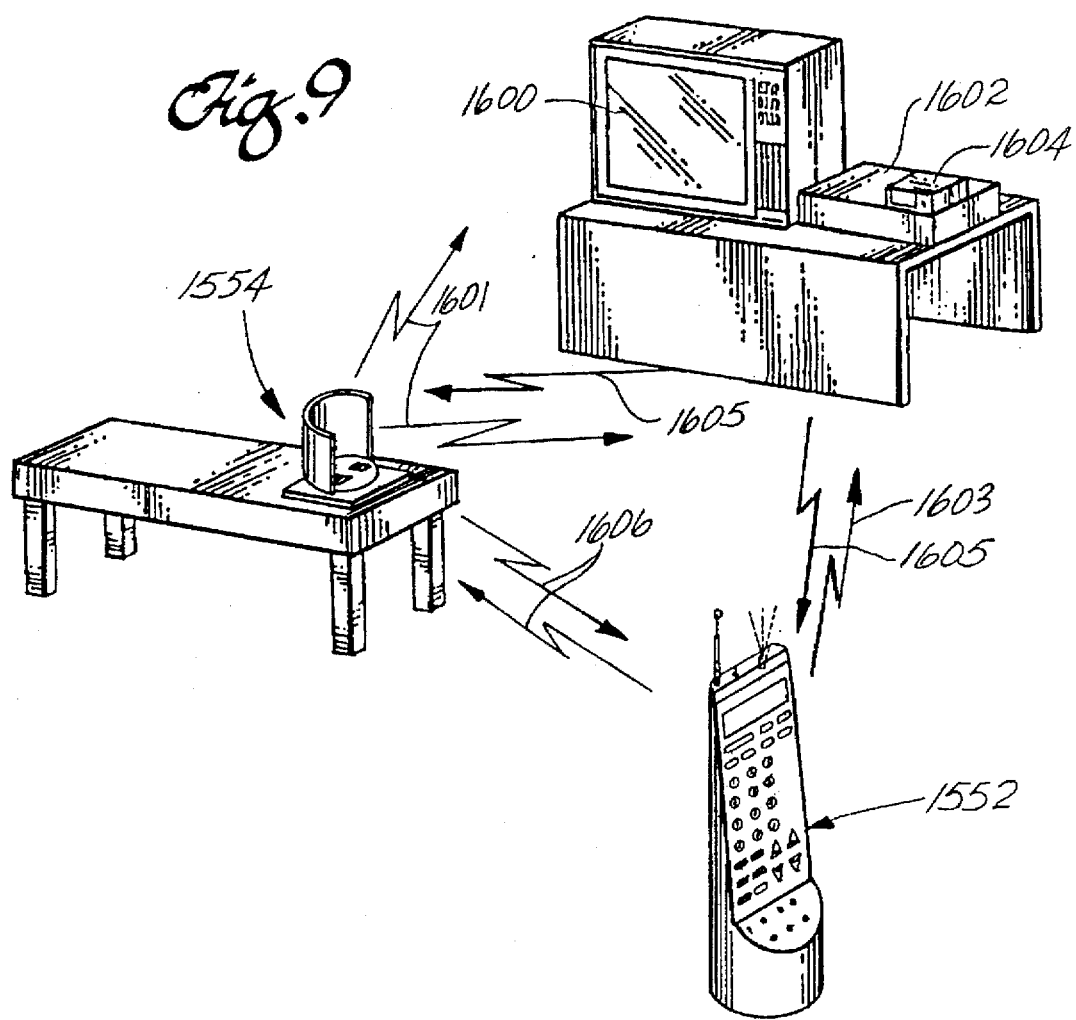
FIG. 9 is a perspective view showing a manner of placing the telephone base unit of FIG. 8 relative to a video cassette recorder, cable box and television set according to an embodiment of the invention.

FIG. 9 shows the telephone base unit 1554 located on a table near a video cassette recorder 1602, a cable box 1604 and a television 1600. The cordless telephone 1552, which can be in the same room as the telephone base unit or be in a different room, communicates with the telephone base unit via RF signals 1606. The telephone base unit controls the VCR, cable box, and television set via IR signals 1601. The cordless telephone, if it is in the same room as the appliances, can also control the appliances via transmission signals 1603, which can be IR signals, or RF signals if the appliances contain an RF receiver.

Television signals can contain embedded information, as discussed above, which can be extracted by the VCR and transmitted to the telephone base unit or to the cordless telephone via transmission signals 1605, which can be IR signals, or RF signals if the appliances contain an RF transmitter. For example the user of the cordless telephone could press the RECEIVE button on the cordless telephone to send a command to the receiver 10005 via an IR transmitter in the cordless telephone, to cause the receiver 10005 to send time and date information, extracted from the VBI of the television signal, to the cordless telephone, which would receive the time and date information via an IR receiver.

Figure 10:
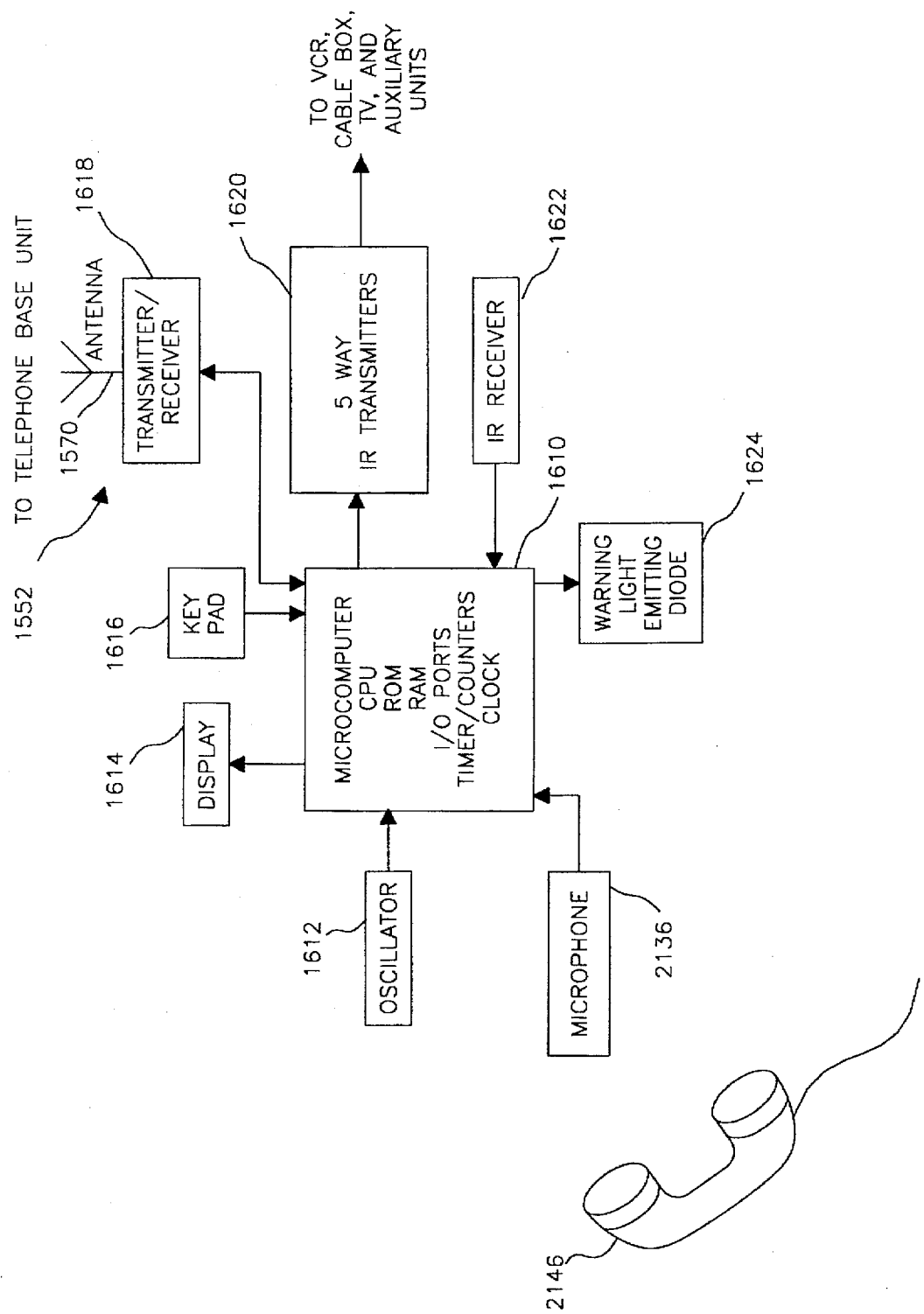
FIG. 10 is a schematic of a cordless telephone including a universal remote controller according to an embodiment of the invention.

FIG. 10 is a block diagram of the cordless telephone. The cordless telephone has a microcomputer 1610, which consists of a CPU, ROM, RAM, I/O ports, timers and counters, and a clock, which can perform the functions of clock/calendar 2020 of FIG. 1. The microcomputer is used to implement the decoding of compressed codes having at least one digit into channel, time-of-day and length commands. Programs stored in the memory of the microcomputer also are instrumental in implementing the other functions of the cordless telephone including the functions of an universal remote controller and the function time setting for clocks. The microcomputer has an input from an oscillator 1612 and inputs from the keypad 1616 on the cordless telephone. The microcomputer drives a LCD display 1614 and also drives a warning light-emitting diode 1624. Communications to the telephone base unit are via transmitter/receiver 1618 and antenna 1570. The cordless telephone can send commands to appliances through the IR transmitter 1620 or the RF transmitter 1618 and can receive information from the appliances via IR receiver 1622 or the RF receiver 3618. A battery provides power to the cordless telephone and can be charged from the telephone base unit. Also included in the block diagram is microphone 2136, which is especially useful in the embodiment in which the cordless telephone does not contain a telephone function, but rather operates as an universal remote controller, a timer preprogrammer for a VCR and a time setter for clocks.

Figure 11:
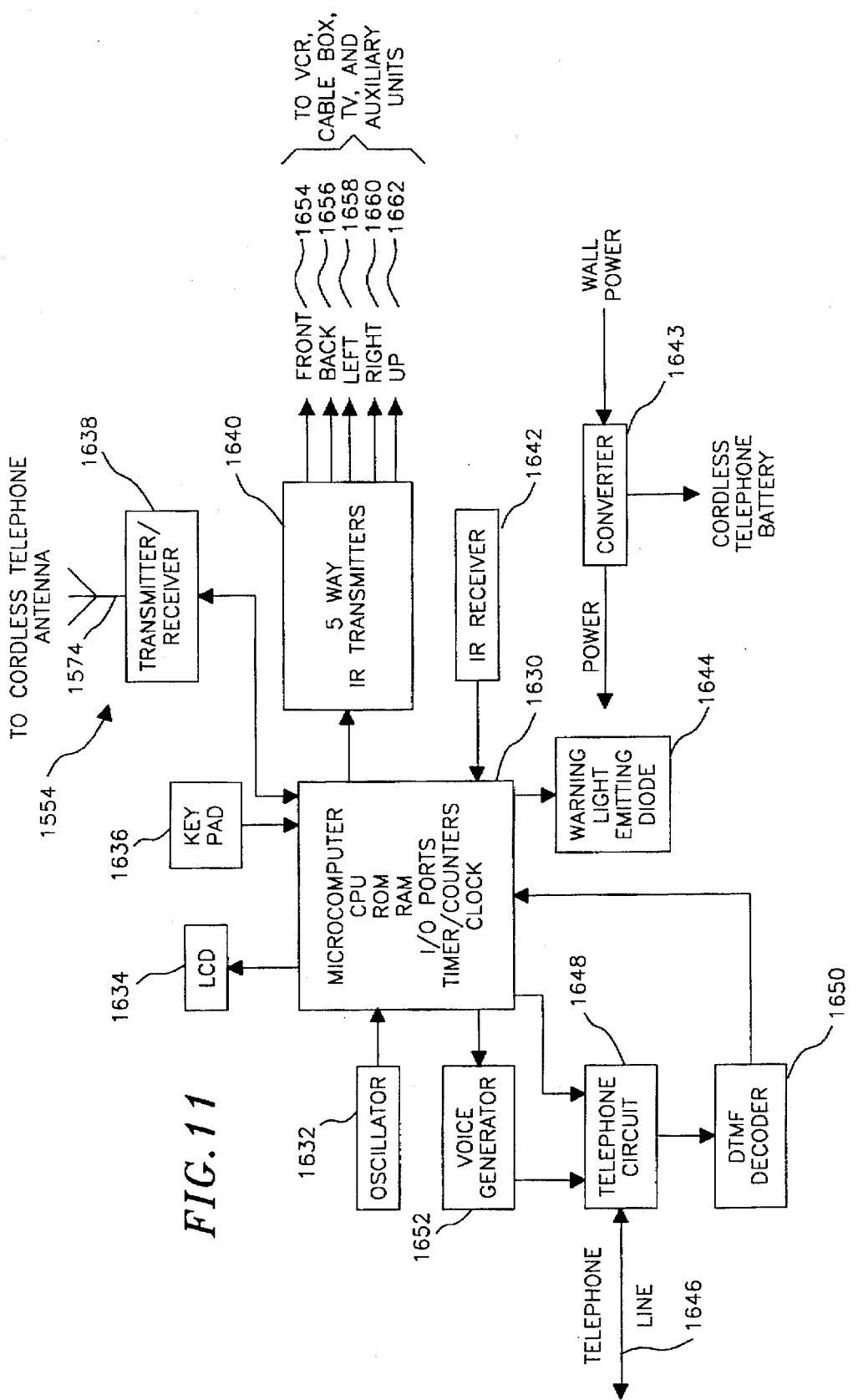
FIG. 11 is a schematic of a telephone set including a universal remote controller according to an embodiment of the invention.

FIG. 11 shows a block diagram of the telephone base unit 1554. The telephone base unit has a microcomputer 1630 which contains a CPU, ROM, RAM, I/O ports, timers and counters, and a clock. The microcomputer is used to implement the decoding of compressed codes having at least one digit into channel, time-of-day and length commands. Programs stored in the memory of the microcomputer also are instrumental in implementing the other functions of the telephone base unit. The microcomputer has input from an oscillator 1632 and from a keypad 1636 on the face of the telephone base unit. The microcomputer drives a LCD display 1634 on the telephone base unit and also drives a warning light-emitting diode 1644. Communication with the cordless telephone is via transmitter/receiver 1638 and antenna 1574. The telephone base unit can send commands to the appliances via five-way IR transmitter 1640, which can transmit to the front, the back, left, right and up to insure communication with the appliances, or via RF transmitter 1638. Information from the appliances can be received by the telephone base unit via IR receiver 1642 or via RF receiver 1638. The telephone base unit contains a converter 1643 for providing power from wall power to the telephone base unit and for charging the cordless telephone battery. The telephone base unit has a direct connection with telephone line 1646 via telephone circuit 1648 which communicates to a DTMF decoder 1650 for input to the microcomputer 1630. As discussed above, instead of connection to a telephone line the telephone base unit could be connected to the telephone network via a cellular network. The microcomputer 1630 can communicate to the telephone circuit 1648 either directly or via voice generator 1652. The voice generator can synthesize speech for requesting a user to enter certain numbers, such as a password or a telephone number.

The telephone base unit and cordless telephone perform all of the functions of the custom programmer 1100 and the functions of an universal remote controller and the function of setting time for clocks. Compressed code decoding for codes compressed from channel, day, time-of-day, and length, is performed by the microcomputers in either the telephone base unit or the cordless telephone and, at the appropriate time, record-on commands are sent to the VCR 1602, and channel-select commands are sent to the cable box 1604, a satellite receiver, and/or the TV 1600. Then, when recording is complete according to the decoded length from the CDTL information for a program to be recorded, the VCR 1602 is commanded to stop recording. The warning light-emitting diode 1624 in the cordless telephone and the warning light-emitting diode 1644 in the telephone base unit have the same function, which is to warn the user that a program is about to be recorded so that a tape is loaded into the VCR, as the warning light 1132 of custom programmer 1100.

Figure 12:
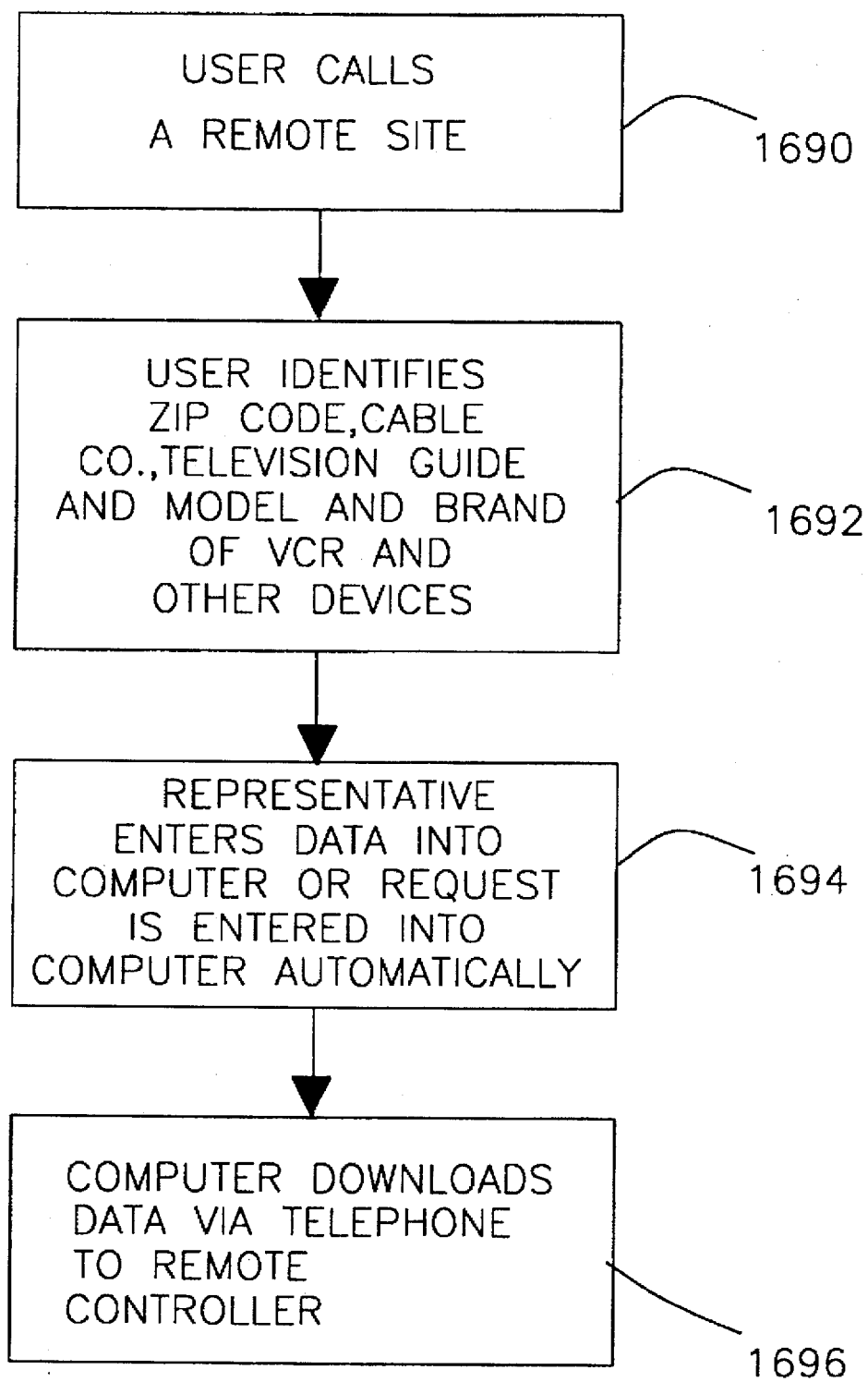
FIG. 12 is a flow diagram of a method for downloading data to a remote controller via a telephone.

FIG. 12 is a flow diagram of a method for downloading data such as time and date to a remote controller, such as cordless telephone 1552 with a microphone 2136. The method is also applicable for the custom programmer 1100, and makes the downloading of initial set-up data much easier. In step 1690, the user calls a remote site, which generally has a computer. Then in step 1692, the user identifies his zip code, the cable carrier, the television guide used by the user, and the model and brand of the VCR, cable box and any other appliances to be controlled, such as a satellite receiver. In step 1692 the user can also request that the time and date be sent from the remote site. In step 1694, the representative enters this data into a computer, or the data or request is entered into the computer at the remote site automatically. Then in step 1696, the computer downloads the data, such as time and date or initial setup data, via telephone to the remote controller.

The data can also be directly downloaded via the telephone line to telephone base unit 1554. Then the telephone base unit via the RF antenna can send the data to the cordless telephone. In general, the download method can be used with any remote controller.

FIG. 13 shows the download format 1700 for downloading data to the custom programmer 1100, the cordless telephone, the telephone set 1550 or other remote controller via telephone. Each binary bit that is sent for the download via telephone is represented by three sine wave cycles of the same frequency. Bit 1 is three cycles of 1.8 kHz and bit 0 is three cycles of 2.8 kHz. The receiver, such as the custom programmer, locks onto the middle cycle and detects whether it is binary 0 or 1.

The header 1710 consists of 10 leading binary zeros and ones and is followed by a training byte 1712, a command byte 1714, a series of data bytes 1716, and the last byte, which is check sum byte 1718. The total number of the data bytes depend on the command byte 1714, but the maximum number should not be greater than 13. Every byte will be nine bits long with one bit of odd parity.

The training byte 1712 is defined as binary 1010 0101, or Hex A5 with the parity binary 1. The command byte is used to explain the data that follows the command byte. The command types include: compressed code, CDTL, clock, pointer for a device, protocol, key data, pattern fragment, format, header/ending timing, reset, channel mapping, RAM dumping, and time and date. For example, the command byte for a time and date data may be 1000 0000 (80H). If this is the command byte, then data bytes contain time and date data 1716.

The described embodiments of the invention are only considered to be preferred and illustrative of the inventive concept, the scope of the invention is not to be restricted to such embodiments. Various and numerous other arrangements may be devised by one skilled in the art without departing from the spirit and scope of this invention.

It is therefore intended by the appended claims to cover any and all such applications, modifications and embodiments within the scope of the present invention.

What is claimed is:

1. A remote controller for controlling a television receiver, the remote controller comprising:
    means for commanding the television receiver to transmit time information to the remote controller;
    clock means for keeping time in the remote controller, said clock means being resettable by the time information; and
    means for transmitting the time from the clock means to a timepiece for setting the time in the timepiece.

2. The remote controller of claim 1 wherein the transmitting means is adapted to transmit the time from the clock means to a watch.

3. The remote controller of claim 2 wherein the transmitting means is adapted to transmit the time from the clock means to a wristwatch.

4. The remote controller of claim 1 further comprising a receiver means coupled to the clock means for receiving the time information.

5. The remote controller of claim 4 wherein the receiver means comprises an infrared receiver.

6. A television signal receiver, comprising:
    clock means for keeping time in the television signal receiver;
    means for extracting a time from a television signal received by the television signal receiver;
    means for updating the time kept by the clock means by the time extracted from the television signal; and
    means for transmitting time read from the clock means to a remote device.

7. The television signal receiver of claim 6 wherein the means for extracting a time from a television signal comprises a vertical blanking interval decoder.

8. The television signal receiver of claim 7 wherein the means for transmitting time read from the clock means comprises an infrared transmitter.

9. A system for setting timepieces, the system comprising:
    a television signal receiver comprising:
        first clock means for keeping time in the television signal receiver;
        means for extracting a time from a television signal received by the television signal receiver;
        means for updating the time kept by the first clock means by the time extracted from the television signal; and
        first means for transmitting time read from the first clock means to a remote controller for setting the time on a second clock means for keeping time in the remote controller;
    the remote controller adapted to control the television signal receiver comprising:
        second clock means for keeping time in the remote controller;
        first receiver means coupled to the second clock means for receiving the time transmitted by the first means for transmitting;
        means for updating the time kept by the second clock means in the remote controller by the time received from the television signal receiver; and
        second means for transmitting time read from the second clock means to a timepiece for setting the time in the timepiece; and
    at least one timepiece comprising:
        third clock means for keeping time in the timepiece;
        second receiver means for receiving a time transmitted from the remote controller; and
        means for updating the time kept by the third clock means in the timepiece by the time received from the remote controller.

10. The system of claim 9 wherein the timepiece is a wristwatch.

11. A system for setting timepieces, the system comprising:
    a remote controller adapted to control a television receiver, the remote controller comprising:
        first clock means for keeping time in the remote controller;
        first receiver means coupled to the first clock means for receiving audio signals representing time from a telephone receiver;

means for updating the time kept by the first clock means in the remote controller by the time received from the telephone receiver; and first means for transmitting time read from the first clock means; and at least one timepiece comprising:

second clock means for keeping time in the timepiece;

second receiver means for receiving the time transmitted from the remote controller; and means for updating the time kept by the second clock means in the timepiece by the time received from the remote controller.

12. The system of claim 11 wherein the timepiece is a wristwatch.

13. A method for setting timepieces, the method comprising the steps of:

providing a television signal receiver having a first clock means for keeping time in the television signal receiver;

providing a remote controller adapted to control the television signal receiver, the remote controller having a second clock means for keeping time in the remote controller;

extracting a time from a television signal received by the television signal receiver;

updating the time kept by the first clock means by the time extracted from the television signal;

sending a command from the remote controller to the television signal receiver to transmit the time kept by the first clock means;

transmitting time read from the first clock means to the remote controller for setting the time on a second clock means for keeping time in the remote controller; and updating the time kept by the second clock means in the remote controller by the time received from the television signal receiver.

14. The method of claim 13 further comprising the steps of:

providing at least one timepiece having a third clock means for keeping time in the timepiece;

transmitting time read from the second clock means in the remote controller to the timepiece for setting the time in the timepiece; and updating the time kept by the third clock means in the timepiece by the time received from the remote controller.

15. The method of claim 14 further comprising the steps of:

providing a reset button on the timepiece; and pressing the reset button to cause the timepiece to receive the transmitted time read from the second clock means in the remote controller.

16. A method for setting timepieces, the method comprising the steps of:

providing a television signal receiver having a first clock means for keeping time in the television signal receiver;

providing at least one timepiece having a second clock means for keeping time in the timepiece;

extracting a time from a television signal received by the television signal receiver;

updating the time kept by the first clock means by the time extracted from the television signal;

transmitting time read from the first clock means to the timepiece for setting the time on a second clock means for keeping time in the timepiece; and updating the time kept by the second clock means in the timepiece by the time received from the television signal receiver.

17. The method of claim 16 further comprising the steps of:

providing a reset button on the timepiece; and pressing the reset button to cause the timepiece to receive the transmitted time read from the second clock means in the remote controller.

18. The method of claim 16 wherein the extracting step further comprises extracting the time from a vertical blanking interval of the television signal.

19. An apparatus for setting timepieces comprising:

a television signal receiver having a first clock means for keeping time in the television signal receiver;

a timepiece having a second clock means for keeping time in the timepiece;

means for extracting a time from a television signal received by the television signal receiver;

means for updating the time kept by the first clock means by the time extracted from the television signal;

means for transmitting time read from the first clock means to the timepiece for setting the time on a second clock means for keeping time in the timepiece;

means for receiving the transmitted time in the timepiece; and means for updating the time kept by the second clock means in the timepiece by the time received from the television signal receiver.

20. The apparatus of claim 19 wherein the means for receiving the transmitted time in the timepiece further comprises a reset button on the timepiece for causing the timepiece to receive the transmitted time read from the first clock means in the television signal receiver.

21. The method of claim 19 wherein the extracting step further comprises extracting the time from a vertical blanking interval of the television signal.

22. A method for setting timepieces, the method comprising the steps of:

providing a remote controller adapted to control a television receiver, the remote controller having a first clock means for keeping time in the remote controller;

providing at least one timepiece having a second clock means for keeping time in the timepiece;

receiving audio signals from a telephone receiver representing time via a microphone in the remote controller;

updating the time kept by the first clock means in the remote controller by the time received from the telephone receiver;

transmitting time read from the first clock means to the timepiece for setting the time in the timepiece;

receiving the time transmitted from the remote controller in the timepiece; and updating the time kept by the second clock means in the timepiece by the time received from the remote controller.

23. The method of claim 22 further comprising the steps of:

providing a reset button on the timepiece; and pressing the reset button to cause the timepiece to receive the transmitted time read from the first clock means in the remote controller.

* * * * *